US007643528B2

(12) United States Patent
Partlo et al.

(10) Patent No.: US 7,643,528 B2
(45) Date of Patent: Jan. 5, 2010

(54) IMMERSION LITHOGRAPHY LASER LIGHT SOURCE WITH PULSE STRETCHER

(75) Inventors: William N. Partlo, Poway, CA (US); Alexander I. Ershov, San Diego, CA (US); German Rylov, Poway, CA (US); Igor V. Fomenkov, San Diego, CA (US); Daniel J. W. Brown, San Diego, CA (US); Christian J. Wittak, San Diego, CA (US); Rajasekhar M. Rao, San Diego, CA (US); Robert A. Bergstedt, Carlsbad, CA (US); John Fitzgerald, San Diego, CA (US); Richard L. Sandstrom, Encinitas, CA (US); Vladimir B. Fleurov, Escondido, CA (US); Robert N. Jacques, San Diego, CA (US); Ed Danielewicz, Carlsbad, CA (US); Robin Swain, Trabuco Canyon, CA (US); Edward Arriola, Huntington Beach, CA (US); Michael Wyatt, Santa Margarita, CA (US); Walter Crosby, Los Alamitos, CA (US)

(73) Assignee: Cymer, Inc., San Diego, CA (US)

( * ) Notice: Subject to any disclaimer, the term of this patent is extended or adjusted under 35 U.S.C. 154(b) by 40 days.

(21) Appl. No.: 11/973,671

(22) Filed: Oct. 10, 2007

(65) Prior Publication Data

US 2009/0080476 A1 Mar. 26, 2009

Related U.S. Application Data

(60) Provisional application No. 60/994,497, filed on Sep. 20, 2007.

(51) Int. Cl.
*H01S 3/22* (2006.01)
(52) U.S. Cl. .............................. 372/55; 372/56; 372/57
(58) Field of Classification Search .................. 372/55, 372/57
See application file for complete search history.

(56) References Cited

U.S. PATENT DOCUMENTS

| 7,369,597 B2 * | 5/2008 | Smith et al. ................... 372/94 |
| 2004/0136417 A1 * | 7/2004 | Webb et al. .................... 372/25 |
| 2007/0280308 A1 * | 12/2007 | Ershov et al. ................. 372/25 |

OTHER PUBLICATIONS

U.S. Appl. No. 11/787,180, filed Apr. 13, 2007, Ershov et al.

\* cited by examiner

*Primary Examiner*—Dung T Nguyen

(57) ABSTRACT

An apparatus and method which may comprise a pulsed gas discharge laser which may comprise a seed laser portion; an amplifier portion receiving the seed laser output and amplifying the optical intensity of each seed pulse; a pulse stretcher which may comprise: a first beam splitter operatively connected with the first delay path and a second pulse stretcher operatively connected with the second delay path; a first optical delay path tower containing the first beam splitter; a second optical delay path tower containing the second beam splitter; one of the first and second optical delay paths may comprise: a plurality of mirrors defining the respective optical delay path including mirrors located in the first tower and in the second tower; the other of the first and second optical delay paths may comprise: a plurality of mirrors defining the respective optical delay path including mirrors only in one of the first tower and the second tower.

11 Claims, 21 Drawing Sheets

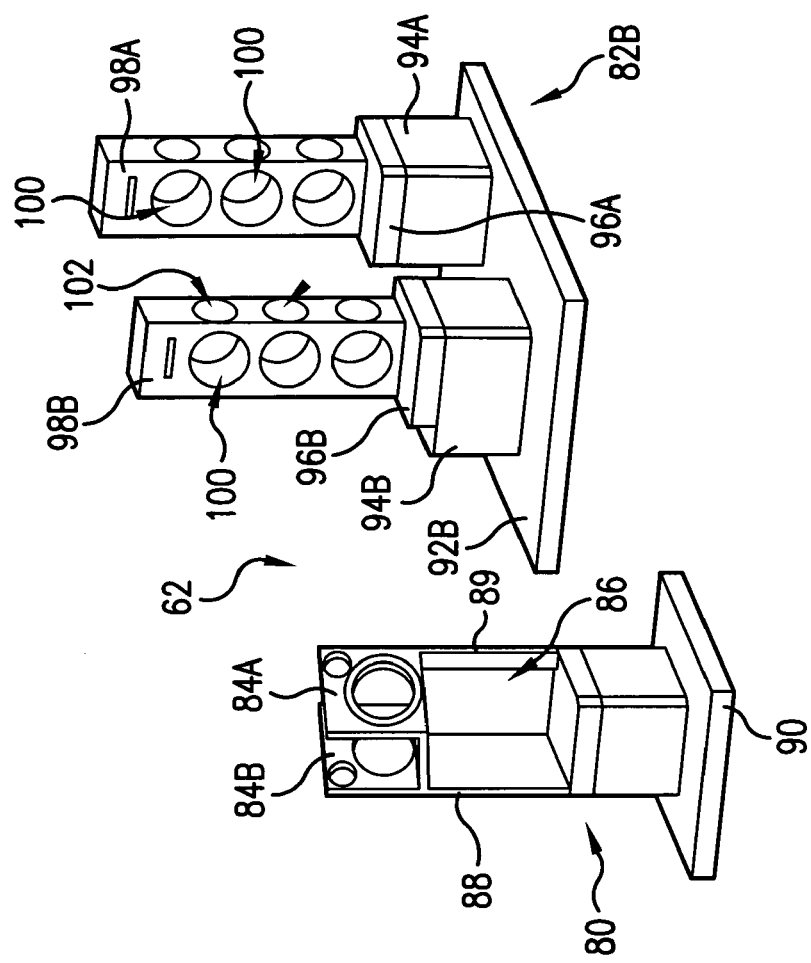
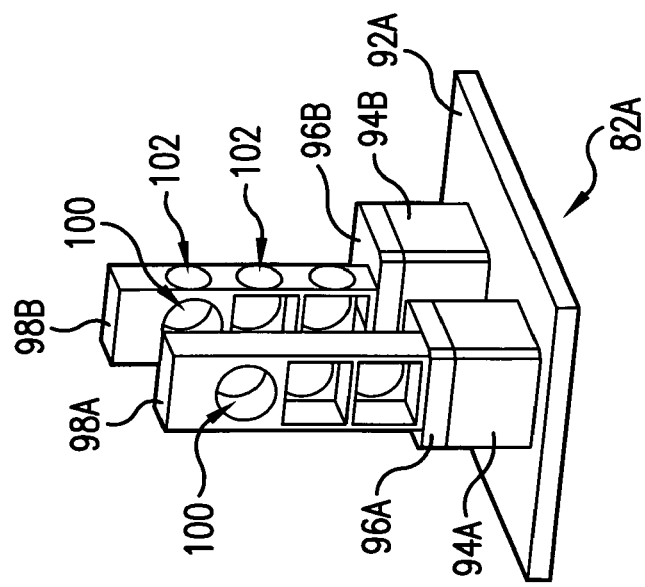
FIG. 2

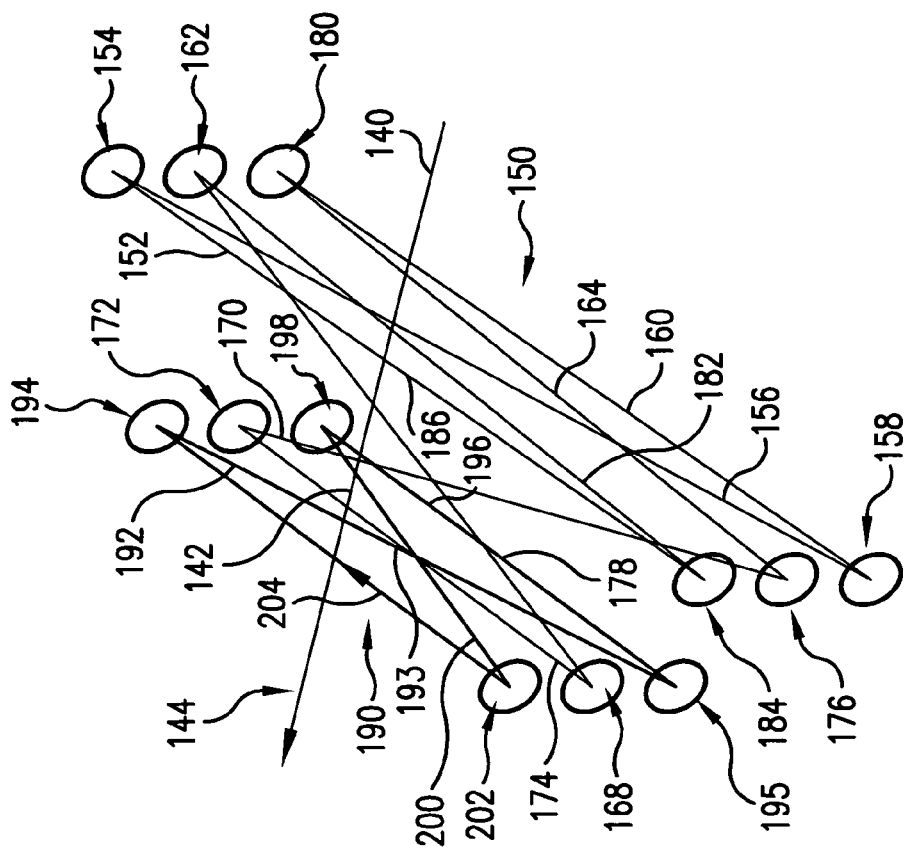
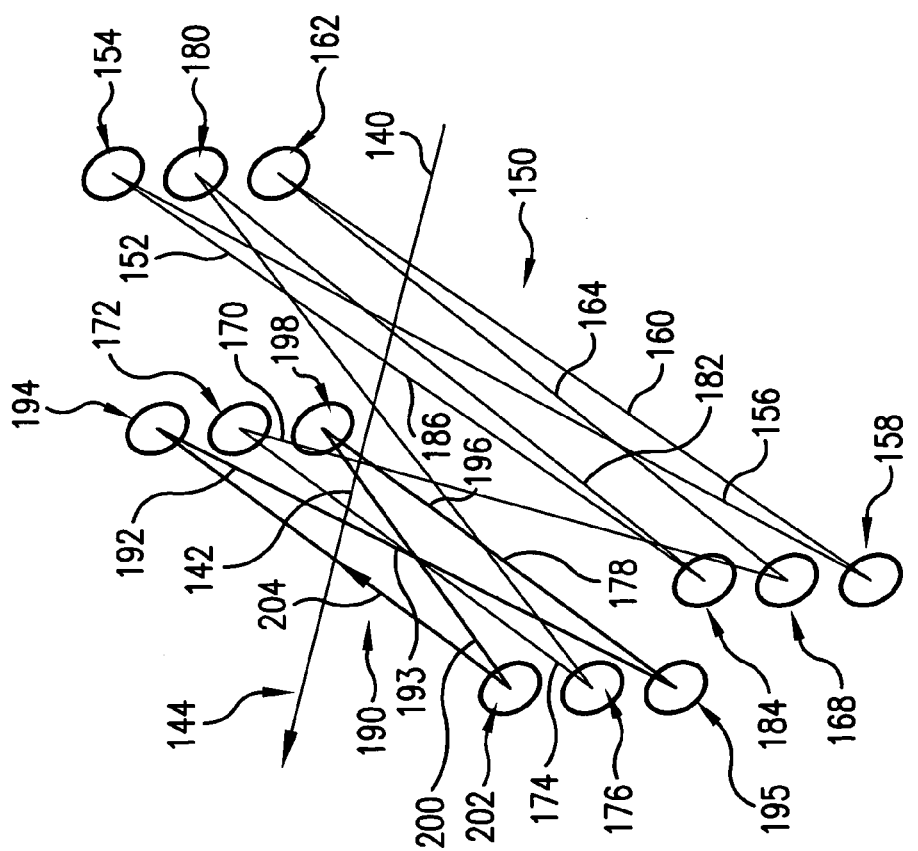

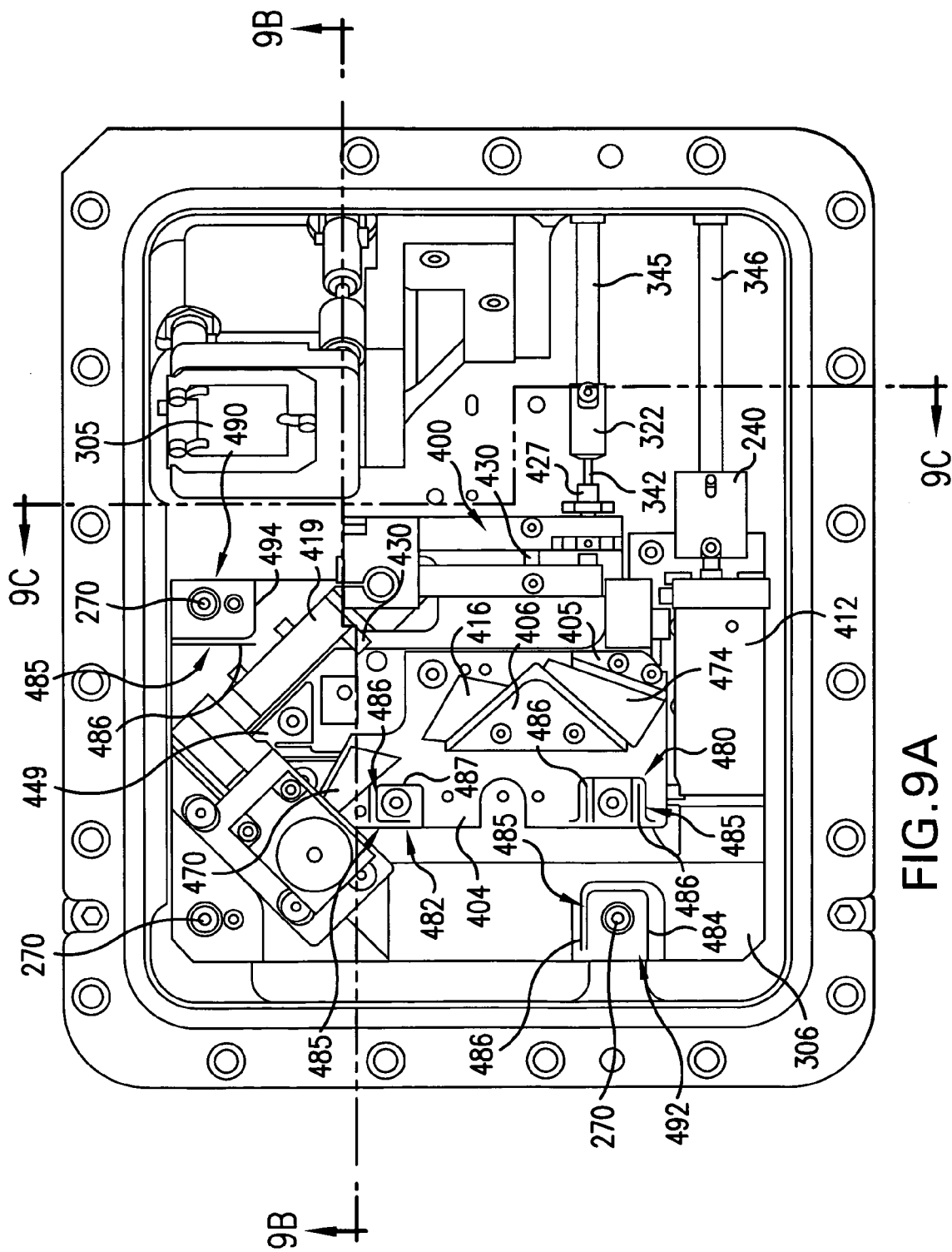

US 7,643,528 B2

IMMERSION LITHOGRAPHY LASER LIGHT SOURCE WITH PULSE STRETCHER

CROSS-REFERENCE TO RELATED APPLICATIONS

This application claims the benefit of U.S. Patent Application Ser. No. 60/994,497, filed Sep. 20, 2007. The present application is related to U.S. patent application Ser. No. 11/787,180 filed on Apr. 13, 2007, entitled LASER SYSTEM, and to U.S. patent application Ser. No. 11/805,583, entitled HIGH POWER EXCIMER LASER WITH A PULSE STRETCHER, filed on May 23, 2007, the disclosures of each of which are incorporated herein by reference.

FIELD

The present disclosed subject matter relates to, laser produced light sources, such as DUV or EUV light sources, such as are used for integrated circuit photolithography manufacturing processes or irradiation processing applications such as elongated beam annealing processes for, e.g., thin film transistor panel production or laser produced plasma EUV light generation, and more specifically to pulse stretching for such laser systems to increase the $T_{is}$ and/or reduce coherence or the like.

BACKGROUND

Pulse stretching has been known in the past for high power pulsed DUV lasers such as are used for integrated circuit manufacturing photolithography processes as a photoresist exposure light source, as is shown, e.g., in the above referenced co-pending Ser. No. 11/805,583 patent application. With increasing pulse energy requirements to meet higher average power requirements, e.g., for new immersion lithography processes used to extend the DUV wavelength light source scanner capabilities to smaller CD nodes, there has developed a need for improved pulse stretching, which at the same time for economic and other reasons there is a need to keep the pulse stretcher in essentially the same footprint as in earlier laser light source systems. According to aspects of embodiments of the disclosed subject matter applicants propose a solution to this dilemma. Similarly Applicants' assignee has chosen to utilize a power amplification stage such as is disclosed in the above referenced co-pending Ser. No. 11/787,180 patent application. Certain optical considerations such as complex alignment issues have led applicants to propose, according to aspects of embodiments of the disclosed subject matter to solutions to problems arising from those considerations.

SUMMARY

An apparatus and method are disclosed which may comprise a pulsed gas discharge laser lithography light source which may comprise a seed laser portion providing a seed laser output light beam of seed pulses; an amplifier portion receiving the seed laser output light beam and amplifying the optical intensity of each seed pulse to provide a high power laser system output light beam of output pulses; a pulse stretcher increasing the number of peaks in the output pulse and decreasing the average peak intensity of each of the output pulses by passing the output pulses through a pair of optical delay paths in series; the pulse stretcher may comprise: a first beam splitter operatively connected with the first delay path and a second pulse stretcher operatively connected with the second delay path; a first optical delay path tower containing the first beam splitter; a second optical delay path tower containing the second beam splitter; one of the first and second optical delay paths may comprise: a plurality of mirrors defining the respective optical delay path including mirrors located in the first tower and in the second tower; the other of the first and second optical delay paths may comprise: a plurality of mirrors defining the respective optical delay path including mirrors only in one of the first tower and the second tower. The first optical delay path and the second optical delay path may be of unequal length. The first optical delay path may be longer than the second optical delay path. The other of the first and second optical delay towers containing mirrors in both of the first and second towers may be the longer of the first and second optical delay paths. The longer of the first and second optical delay paths may be the first optical delay path in the series arrangement. The mirrors may comprise imaging mirrors in a confocal or non-confocal arrangement.

An apparatus and method are disclosed which may comprise a pulsed gas discharge laser lithography light source which may comprise a seed laser portion providing a seed laser output light beam of seed pulses; an amplifier portion receiving the seed laser output light beam and amplifying the optical intensity of each seed pulse to provide a high power laser system output light beam of output pulses; the amplifier portion may comprise a ring power amplifier comprising amplifier portion injection optics comprising at least one beam expanding prism, a beam reverser and an input/output coupler; the beam expansion optics and the output coupler may be mounted on an optics assembly with the beam expansion optics rigidly mounted with respect to the optics assembly and the input/output coupler mounted for relative movement with respect to the optics assembly for optical alignment purposes. The input/output coupler may be mounted for movement with respect to the optic assembly in a first axis and a second axis. The first axis and second axis may be generally orthogonal to each other. The amplifier injection optics may be contained within an amplifier portion injection optics assembly box and the input/output coupler may comprise at least one through-the-wall adjusting actuator to adjust the position of the input/output coupler in at least one axis.

BRIEF DESCRIPTION OF THE DRAWINGS

FIG. 2 shows a perspective view of mirror mounts forming a pair of optical delay path towers according to aspects of an embodiment of the disclosed subject matter;

FIGS. 3A and 3B illustrate partly schematically optical delay paths with one delay path sharing tower mirror mounts with the tower of the other delay path according to aspects of an embodiment of the disclosed subject matter;

FIGS. 9A, 9B, 9C and 9D show, respectively, a top plan view, a first and a second cross-sectional view and a detail view of a seed laser injection system enclosure box bottom and its contents according to aspects of an embodiment of the disclosed subject matter;

DETAILED DESCRIPTION OF THE DISCLOSED SUBJECT MATTER

Figure 1:
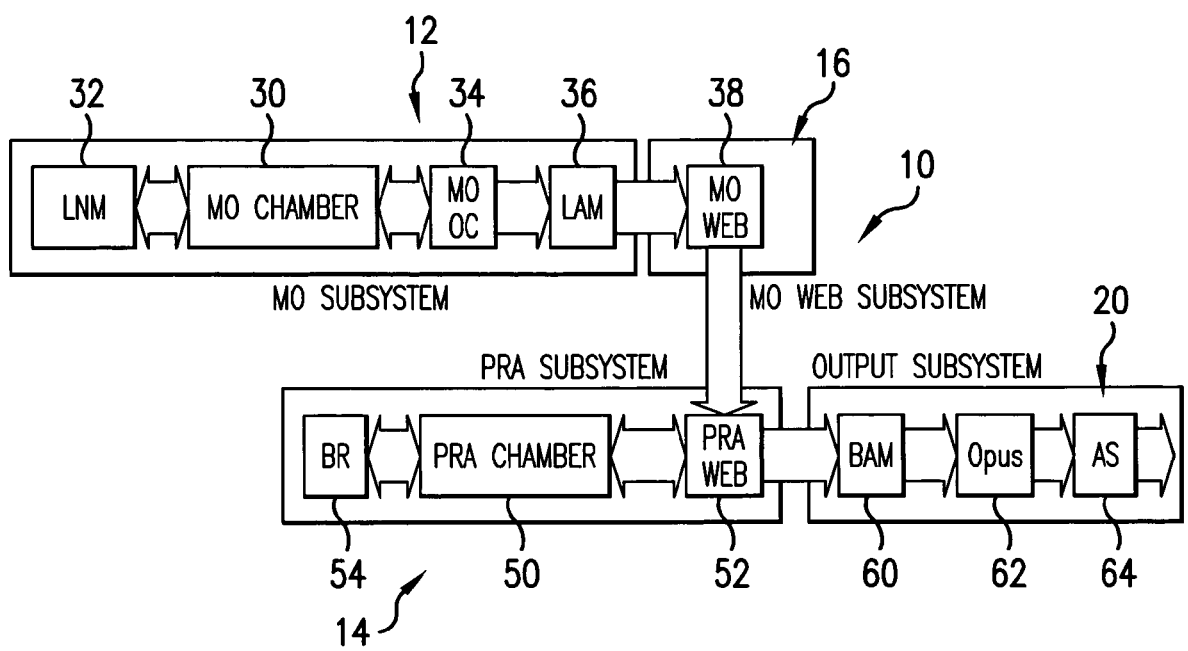
FIG. 1 shows schematically and in block diagram form a high poser lithography laser light source according to aspects of an embodiment of the disclosed subject matter.

According to aspects of an embodiment of the disclosed subject matter a very high power, e.g., 90 W or better very high pulse repetition rate, e.g., upwards of 6 kHz and above, gas discharge laser system 10, as shown illustratively and in block diagram for in FIG. 1 can be provided with a simple and compact pulse stretcher, which applicants' assignee refers to as an Optical Pulse Stretcher ("OPuS") 62, which may be defined by certain required optical and mechanical performance specifications. Table I indicates abbreviations, terms and acronyms that may be used in the description of aspects of embodiments of the disclosed subject matter.

TABLE I

| Term/Acronym | Definition |
| --- | --- |
| AS | Autoshutter |
| BAM | Bandwidth Analysis Module. Measures bandwidth and pulse energy. |
| BR | Beam Reverser - Refers to the module that redirects the beam for the second pass through the PRA chamber |
| FWHM | Full Width at Half Maximum. A common measure of pulse width. |
| HR | High Reflector |
| IMS | Interlock Management System |
| IRM | Imaging Relay Mirrors |
| LAM | Line center Analysis Module. Measures wavelength and pulse energy. |
| LNM | Line Narrowing Module. |
| MO | Master Oscillator. The laser resonator in a MOPRA system. It generates pulses with the necessary spectral properties but insufficient pulse energy. |
| MOPRA | Master Oscillator-Power Ring Amplifier. The two-chamber laser architecture. |
| OC | Output Coupler. |
| OPuS | Optical Pulse Stretcher. |
| 4x OPuS | A version of an OPuS that combines two pulse stretchers in series to achieve a $T_{IS}$ magnification of 4 |
| PRA | Power Ring Amplifier. The second chamber in a MOPRA system. When the pulses from the MO pass through the gain medium of the PRA, the necessary pulse energy is obtained for the ultimate laser system output. |
| $T_{IS}$ | Time Integral Squared |
| TWA | Through the Wall Adjuster |
| WEB | Wavefront Engineering Box. Refers to the modules that steer the beam from the MO to the PRA. |

Turning now to FIG. 1 there is illustrated a gas discharge laser system 10, which may include, e.g., a solid state or gas discharge seed laser system 12, illustrated as a relatively broad band gas discharge seed system 12, an amplification stage, e.g., a power ring amplifier ("PRA") stage 14, such as is discussed in more detail in the U.S. application Ser. No. 11/787,180 referenced above, relay optics 16 and laser system output optics 20. The seed system may include, e.g., a seed laser chamber 30, in which, e.g., electrical discharges between electrodes (not shown) may cause lasing gas discharges in a lasing gas to create an inverted population of high energy molecules, e.g., including Ar, Kr, Xe or $CO_2$ to produce relatively broad band radiation which may be line narrowed to a relatively very narrow bandwidth and center wavelength selected in a line narrowing module ("LNM") 32, as is known in the art. The seed laser system 12 may also include an output coupler 34, which may comprise a partially reflective mirror, forming with a reflective grating (not shown) in the LNM 32, an oscillator cavity in which the seed laser 12 oscillates to form the seed laser output pulse, i.e., forming a master oscillator ("MO"). A MO wavefront engineering box ("WEB") 38 may serve to redierect the output of the MO seed laser system 12 toward the amplification stage 14, and may include, e.g., beam expansion with, e.g., a multi prism beam expander (not shown) and coherence busting, e.g., in the form of an optical delay path (not shown) as is also discussed in more detail in the U.S. application Ser. No. 11/787,180 referenced above.

The amplification stage 14 may include, e.g., a lasing chamber 50, which may also be an oscillator, e.g., formed by seed beam injection and output coupling optics (not shown) which may be incorporated into a PRA wavefront engineering box ("WEB") 52 and may be redirected back through the gain medium in the chamber 50 by a beam reverser 54. The PRA WEB 52 may incorporate a partially reflective input/output coupler (not shown) and a maximally reflective mirror for the nominal operating wavelength (e.g., at around 193 nm for an ArF system) and beam expansion prisms as are more fully described in the just referenced U.S. application.

A bandwidth analysis module ("BAM") 60 at the output of the amplification stage 14 may receive the output laser light beam of pulses from the amplification stage and pick off a small portion for metrology purposes, e.g., to measure the output bandwidth and pulse energy. The laser output light beam of pulses then passes through an OPuS 62, discussed in more detail below and an output auto shutter 64, which may also be the location of a pulse energy meter in lieu of in the BAM 60.

Figure 5A:
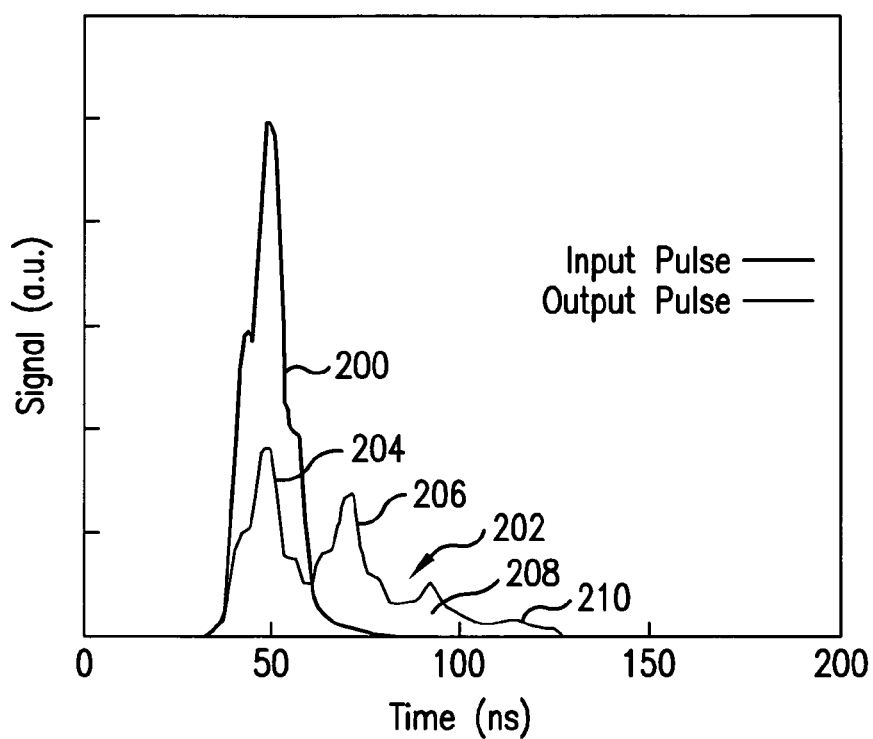
FIGS. 5A and 5B illustrate the effect of pulse stretching in a first delay path followed by a second delay path in series according to aspects of an embodiment of the disclosed subject matter.
Figure 5B:
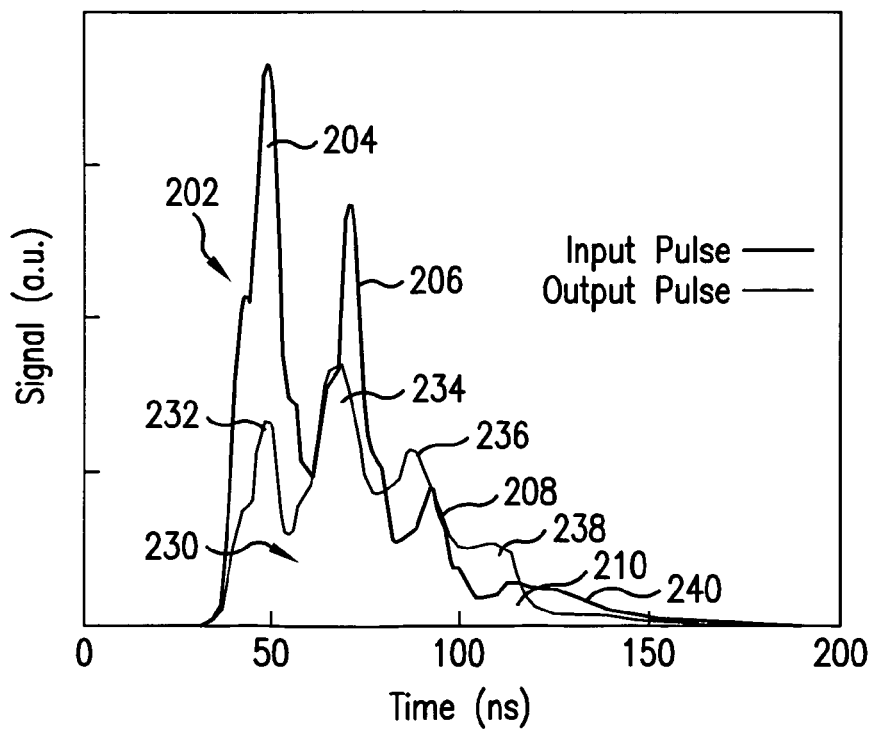

The OPuS module 62 may be mounted vertically between a laser system Bandwidth Analysis Module ("BAM") 60 at the output of the laser amplifier portion 14 and the autoshutter 64, forming the output of the laser system 10 itself. The purpose of the OPuS 62 may be, e.g., to convert a single output laser pulse, e.g., as illustrated in FIG. 5A, into a pulse train, e.g., as illustrated in FIGS. 5A and 5B together. Each one of the secondary pulses, e.g., 204, 206, 208 and 210 in FIG. 5A and 232, 234, 236, 238 and 240 in FIG. 5B, e.g., created from the original pulse 200 shown illustratively in FIG. 5A, e.g., may be delayed with respect to each other in time. By distributing the original laser pulse energy into a train of secondary pulses, the effective pulse length of the laser can be expanded and at the same time the peak pulse intensity reduced. The OPuS module 62 can thus receive the laser beam from the PRA WEB 60 and direct the output of the OPuS 62 to the autoshutter 64. FIG. 5 A shows illustratively the effect of a 22 ns delay path with 97% reflective mirrors and a 60% reflective beam splitter (with an 8% loss) and an input pulse (from the laser) $T_{is}$ of 20.78 ns resulting in a 53.97 ns $T_{is}$ output and FIG. 5B illustrates by way of example putting that pulse through a second 18 ns delay path using 97% reflectivity mirrors with a 60% reflective beam splitter (8% loss), resulting in an 81.9 ns. Such an OPuS is exemplary of state of the art pulse stretchers of this kind and needs to be improved to about 100 ns $T_{is}$, e.g., by, according to aspects of an embodiment of the disclosed subject matter increasing the first delay path to about 42 ns while maintaining essentially the same footprint (e.g., same enclosure available space in the laser system frame)

The function of the OPuS module 62 is to, e.g., increase the output pulse length of the laser beam produced by the PRA 14. If unmodified the short pulse length, e.g., illustrated as pulse 200 in FIG. 5A, together with the high energy and DUV wavelength of the output beam from the PRA 14, can, e.g., damage the optics of, e.g., a photolithography system using for manufacturing integrated circuits, and receiving the output laser light, for which the laser system 10 is designed, as is discussed in some further detail in the U.S. application Ser. No. 11/787,180 referenced above. This damage can take on several forms, e.g., photon induced absorption and photon induced index variation. The index variation damage mechanism can be subdivided into several categories, e.g., compaction and de-compaction. At this time, however, only compaction has been determined to be dependent upon pulse length. Compaction is a process of densification, which causes, e.g., a change in the index of refraction. The amount of compaction has been found to be inversely proportional to the pulse width of the incident beam. Thus the higher the time integrated squared function of the laser output light pulse ("$T_{is}$") the better.

According to calculations that have been done, one can expect that the maximum $T_{IS}$ magnification of a pulse stretcher, such as is described in more detail below, for an input pulse with a $T_{IS}$ of 19 nsec is about 2.75, with an efficiency of about 86%. Another notable item of interest is the sensitivity of the $T_{IS}$ magnification to beam splitter (a part of the described OPuS pulse stretcher 62) reflectivity. Variations in beam splitter reflectivity can have a significantly higher effect on $T_{IS}$ magnification than output efficiency. Thus, the output pulse length could be well below specification while the output efficiency could be little changed. In addition to beam splitter reflectivity, the reflectivity of the imaging relay mirrors "IRM", e.g., as illustrated in FIGS. 3A and 3B also have a significant impact on $T_{IS}$ magnification. However, unlike the beam splitter(s), the reflectivity of the IRMs have a significant impact on the output efficiency. Input pulse length also influences $T_{IS}$ magnification. The $T_{IS}$ metric for measuring pulse length is maximized when each of the sub-pulses are completely separated in time. Since the delay length of the pulse stretcher, e.g., OPuS 62, is fixed, its $T_{IS}$ magnification capability can, e.g., be continually diminished as the input pulse length becomes increasingly longer than its fixed delay length. The input pulse length, however, has no effect on the output efficiency of the pulse stretcher.

According to aspects of an embodiment of the disclosed subject matter, the physical size of the pulse stretcher can be directly related to the output pulse width size from the PRA 14 and the pulse width size specified for the output of the laser system 10. The design can be based on the assumption that the output pulse width of the PRA 14 has a $T_{IS}$ of 40 nsec and the required output $T_{IS}$ of the laser system 10 is 115 nsec. The OPUS module 62 may then occupy an envelope of dimensions given by a length of 1750 mm, a width of 125 mm, and height of 250 mm and accommodate a 12 mm×12 mm to 15 mm×15 mm size laser beam.

Another factor that influences $T_{IS}$ magnification can be polarization. The beam splitter, e.g., for the input into each delay path 150, 190, may be coated to obtain a specific reflectivity for a given polarization. If the polarization is different than that for which the coating is designed, the polarization variance can have the effect of changing the reflectivity of the beam splitter. The beam splitter's reflectivity change can, in turn, change the $T_{IS}$ magnification, as previously noted. Polarization effects of the OPUS 62 are also not limited to $T_{IS}$ magnification. The OPuS 62 beam splitter(s) can change the polarization state of the input beam polarization. These effects may be most evident, e.g., when the beam splitter is subjected to a high power load. At high power the beam splitter may be thermally stressed, e.g., by its finite absorption. This thermal stress may, in turn, increase the magnitude of the intrinsic birefringence of the beam splitter. The beam splitters of the first delay path 150 and second delay path 190 of the OPUS 62 may be particularly sensitive to small amounts of birefringence since the beam may refract through the optic up to as many as six times and each pass through the beam splitter has a cumulative effect on the polarization. This power induced birefringence of the beam splitter manifests itself as a degradation of the output laser polarization purity, particularly for the beam splitter in the first delay path 150.

To mitigate the effects of power induced birefringence, the beam splitter optic(s) can be rotated or clocked to find an orientation that has a birefringence null. This can involve illuminating a test sample with a highly polarized beam and observing the polarization changes of the beam after it has been transmitted by the sample. In addition to clocking, the power induced birefringence can be reduced by minimizing the amount of absorption of the beam splitter. It has been found that the most significant contributor to absorption is the beam splitter coating. If the coating materials are chosen to minimize absorption, the thermal stress on the optic can be reduced.

If the $T_{IS}$ magnification needs to be increased beyond what is capable from a single pulse stretcher, two pulse stretchers can be connected in series. This may be explained by the fact that a single pulse stretcher can only produce a finite amount of secondary pulses with significant amplitude defined as those with amplitude greater than from about 1% to 5% of that of the input pulse. The amount of significant secondary pulses produced from the original input pulse can be effectively squared in a dual pulse stretcher design.

Unfortunately, according to certain applications of aspects of an embodiment of the disclosed subject matter a maximum output pulse length from a second pulse stretcher delay path, e.g., 190, may not be 2.75 times the output pulse length of the first pulse stretcher delay path 150. The reason is that in order for the second pulse stretcher to obtain the same pulse length magnification as the first it should have an optical delay equal to the pulse length of its input. If the first pulse stretcher delay path, e.g., 150, expands the pulse length to 55 nsec, the second pulse stretcher delay path, e.g., 190, could require a delay of 55 nsec. This could require a physical length of 413 cm (4130 mm). If the second pulse stretcher delay path 190 is, e.g., constrained to have a delay length equal to or shorter than the first pulse stretcher delay path 150, than each of the output pulses can be overlapped in time which can, e.g., reduce the maximum pulse length expansion capability from the maximum value of 2.75.

Additionally, if the optical delay path, e.g., 150 and 190 of each of the pulse stretchers, e.g., in a two delay path OPuS 62, is different, a greater increase in the output pulse length can be obtained than two pulse stretchers with the same optical delay. This is a result of the non-uniform, temporal distribution of the input pulse. Having the second pulse stretcher with a different optical delay than the first can creates an additional degree of freedom of changing the temporal location of the pulse train output of the second pulse stretcher delay path 190 with respect to the pulse train output of the first pulse stretcher delay path 150. This can create the possibility of designing the optical delay of the second pulse stretcher delay path 190 to fill in the holes (areas of low amplitude) of the pulse train produced by the first pulse stretcher delay path 150.

According to aspects of an embodiment of the disclosed subject matter the OPuS module 62 may incorporate a plurality of, e.g., three base plates 92A, 92B and 90. Two of the baseplates, 92A and 92B may, e.g., mount each of a pair of IRM mirror mounts 98A for the longer first delay path 150 and 98B for the shorter second delay path 190. The third baseplate 90 may attach the beam splitter mount 80. The baseplates 82A, 82B and 90 may be made of stainless steel to match the material of the vertical optics table (not shown). Having the baseplates 92A, 92B and 90 separable from the enclosure(s) of the modules can enable extension of the surface of the optics table so that the optics mounts can mount directly to it. The stability and rigidity of the vertical optics table can provide an accurate mounting surface for the optics. In addition, however, due to the difficulty in precision cleaning the vertical table, the base plates 92A, 92B and 90 may be used to provide a clean extension of the vertical table.

Figure 4:
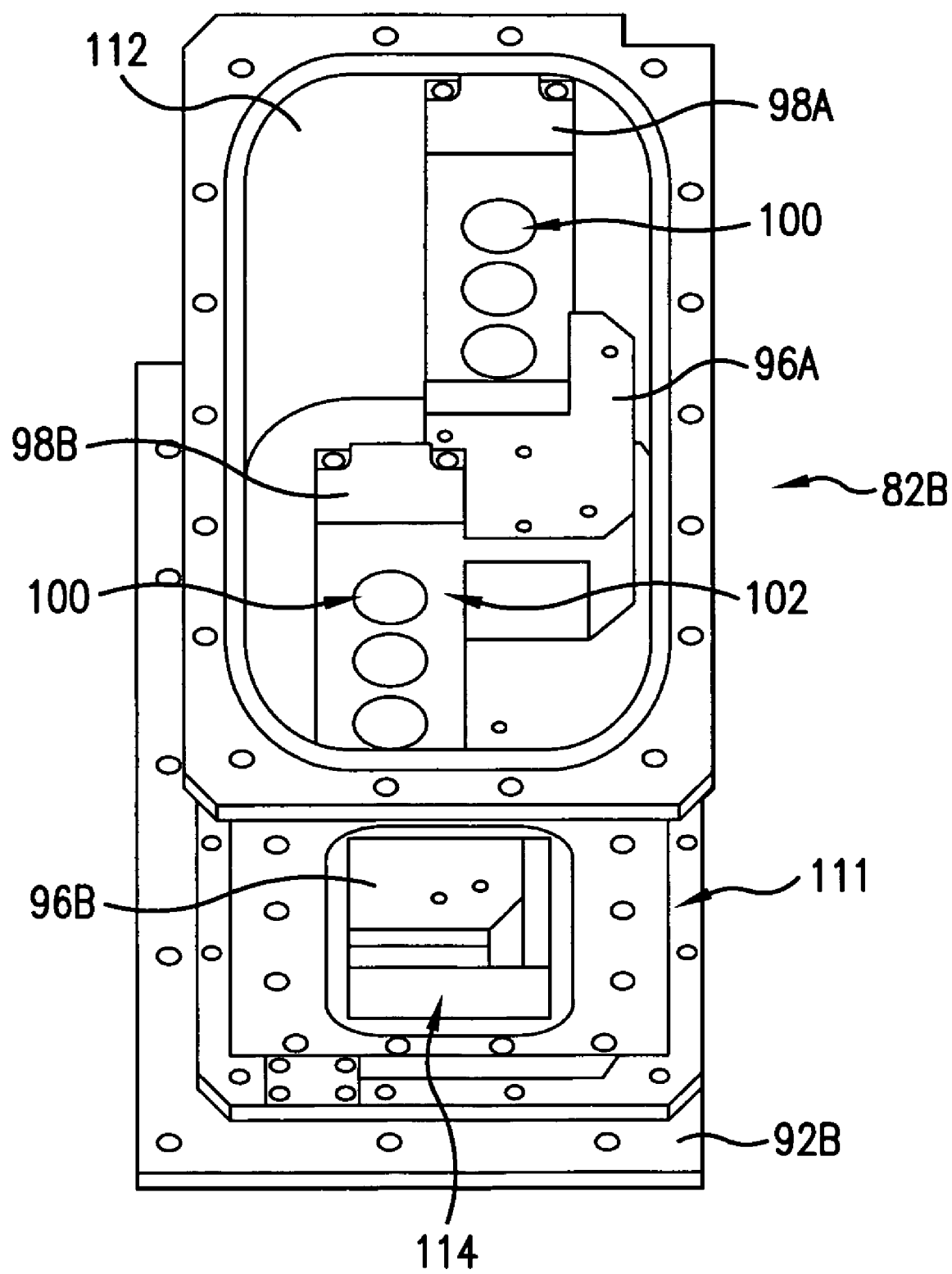
FIG. 4 shows a perspective view of an opened end box containing mirror mounts from a pair of delay path mirror towers forming part of an optical path enclosure according to aspects of an embodiment of the disclosed subject matter.

Individual covers similar to that shown as 82B in FIG. 4 may be used in the OPuS module 62. The covers may be used, e.g., to enclose the mirror mounts 98A and 98B, e.g., shown in FIG. 4, having a housing 110 including a housing wall 112, and a beam passage opening 114, and the middle box 122 of the OPuS enclosure, which may house the beam splitter mounts 84 and beam passage opening 86, between a rear wall 88 and a stanchion 89. Two end boxes, as shown in more detail in the above referenced co-pending Ser. No. 11/805,583 patent application may contain both features for through-the-wall adjusters ("TWA's") and view ports. TWA's may provide a sealed mechanical feed through to certain IRM adjustments and the alignment shutter that may be meant to be adjustable without breaking the enclosure. The view port feature of the cover boxes, e.g., the end boxes, may provide a quick alignment diagnostic capability. They may, e.g., provide a view of the beam footprint on a respective IRM without the need for removing the respective end box covers. The covers may also provide service access ports for field replaceable optical subassemblies and components. Also, the covers may be made of aluminum and can be exposed to the nitrogen purged volume they may need to be nickel plated, e.g., with electroless nickel plating. An enclosure 130 for the OPuS 62 may be, e.g., an aluminum weldment, which may have flanges on both sides to attach to and seal with both the baseplates 90, 92A, 92B and the covers. The enclosure may also need to be nickel plated.

Each of the imaging relay mirror mounts 98A and 98B may contain three IRMs, e.g., in the openings 100 shown in FIG. 2. The mounts 98A and 98B may be designed to allow for at least one of the mirrors to be adjustable, e.g., via a TWA's while other mirrors may have an adjustment accessible from only inside the module enclosure. The TWA adjustments may be accessed through the covers 120a, 120B, e.g., via a sealed mechanical feed-through. The IRM optical mounts 98A, 98B may also be nickel plated. A beam splitter mount 80 may contain the beam splitter optic or optics (not shown) held in the beam splitter mounting plates 84A (for the first delay path 150) and 84B (for the second delay path 190). The mount 80 may also provide the attachment surface for the system aperture. The mount 80 may have no adjustments for the beam splitter mirrors (not shown) held in the respective mounting plate 84A, 84 B, and may also be a field replaceable unit. The mount 80 may also be nickel plated. A system aperture will be attached to the beam splitter mount and will be located after the beam splitter optic(s) held in the respective one of the mounting plates 84 A and 84 B. The aperture size may be 12×12 mm and may be used to provide the point of reference for measuring the laser system beam parameters.

Turning now to FIGS. 3A and 3B there is illustrated schematically and not to scale a perspective view of the optics in an OPuS module 62, which may comprise, e.g., a first delay path 150 and a second delay path for an Opus module 62 according to aspects of an embodiment of the disclosed subject matter. In the first delay path an input laser light beam 140 of pulses, e.g., output from the BAM 60 may enter the delay path 150, e.g., by being split in a partially reflective beam splitter mirror. to form, e.g., an output beam 142 of laser pulses from the first delay path 150 and a first delay path 152 from the beam splitter (not shown) to the first imaging relay mirror 154, which sends a beam along a second path 156 to the second imaging relay mirror 158, which in turn reflects a beam 160 to a third mirror 162, from which mirror 162 is reflected a beam along a fourth path 164, which may, e.g., intersect the beam 156 at a focal point of the mirrors 154 and 162, to a fourth imaging relay mirror 168, which may, in turn reflect the beam of laser pulses along a fifth path 170 to a fifth imaging relay mirror 172, which in turn may reflect the beam along a sixth path 174 to a sixth imaging relay mirror 176, and thence also along a seventh delay path 178, crossing the beam 170 at a focal point of the mirrors 170 and 176, to a seventh imaging relay mirror 180, and further along an eighth delay path 182 to the final eighth mirror 184 of the delay path 150, from which the beam is reflected along a ninth path 186 back to the beam splitter (not shown) for delay path 150. A wedge or like alignment optic may be, e.g., in the ninth delay path to align the portion of the beam along path 186 with the portion of the beam 142 that initially was not reflected by the beam splitter at the entry to delay path 150.

The beam 142 may form the input for a second OPuS delay path 190, which may be a partially reflective mirror that transmits an output beam 144 and a beam traveling along a first delay path 192 of the optical delay 190 to a first imaging relay mirror 194, from which is reflected a beam along a second delay path 193, to a second imaging relay mirror 195, and thence to a third path 196 to a third imaging relay mirror 198, followed by a fourth path 200 and a fourth imaging relay mirror 202, followed by a fifth path 204 returning back to the beam splitter (not shown) for the second delay path 190, which may also include an aligning wedge to align the output of the beam splitter resulting from the incidence of the beam along delay path 204 with the transmitted portion of the beam 142 received from the output of the first delay path 150 and the portion of the original laser input beam 140 transmitted by the first delay path beam splitter (not shown) and, therefore, not input into thee first optical delay path 150.

It will be noted that the mirrors 172 and 176 in the first delay path 150 may be housed in the mirror mounts 98B (as shown in FIG. 2 for the second delay path Turning to FIGS. 5A and 5B there is illustrated by way of example two graphs depicting an example of a maximum output pulse length produced from two pulse stretchers delay paths, e.g., 150 and 190, connected in series with the path length constraint that, e.g., the maximum optical delay of a single pulse stretcher is 22 nsec. The reflectivity of the IRMs was assumed to be greater than 97% and the loss at the beam splitter is assumed to be 8% per pass. If the input pulse $T_{IS}$ is 20.8 nsec and the delay length of the first pulse stretcher is 22 nsec, the output pulse $T_{IS}$ from the first pulse stretcher will be approximately 54 nsec[, incorporating peaks 204, 206, 208, and 210 of FIGS.

5A and 5B.]. If the output from the first pulse stretcher is then input to a second pulse stretcher, e.g., with a delay of 18 nsec, the final output pulse $T_{IS}$ will be approximately 82 nsec[, incorporating peaks 323, 324, 236, 238, and 240 in FIG. 5B.]. Although the pulse length expansion of two pulse stretchers in series may not simply multiply, the output efficiency may multiply. Therefore, if the reflectivity of the imaging relay mirrors is estimated to be 97% and the absorption and reflection losses for each pass through the beam splitter is 2%, then the expected output efficiency of two pulse stretchers in series would be (0.85)(0.85) or about 70%.

The OPuS module 62 may be composed of the following internal components. A beam splitter mount 80 and optics which may serve to, e.g., direct a percentage of the incident beam (output laser beam of pulses from the PRA 14) to the IRMs forming a first delay path 150 (FIGS. 3A and 3B) while transmitting the rest of the output beam of pulses from the laser system 10, e.g., to a second pulse stretcher delay path 190. The first beam splitter (not shown in FIG. 3A or FIG. 3B) in the OPuS module 62 can have a predetermined reflectivity and transmission. However, the exact values of transmission and reflection may be dependent upon the optical configuration of the OPuS module 62. Imaging relay mirrors, e.g., 154, 158, 162, 168, 172, 176 and 180 of the first delay path 150 illustrated schematically in FIGS. 3A and 3B, may be mounted on a pair of imaging mirror mounts 82A and 82 B (FIG. 2). The IRMs may preserve the spatial and divergence properties of the input beam 140 while, e.g., also propagating it through a first delay path 150 before it is recombined with the original incident beam 140 to form, e.g., the input beam 142 for a second OPuS module 62 delay path 190. The IRMs may be spherical concave mirrors, e.g., also coated for maximum reflection at normal incidence for a given nominal wavelength. A system aperture (not shown) may be attached to the beam splitter mount 80 after the beam splitter optic (not shown). This aperture may be used to determine the output laser beam size. An alignment shutter (not shown) may also be used as an adjustable beam block. Through the wall adjusters ("TWAs") may be used to enable an operator to adjust the internal imaging relay mirror mounts for a respective individual mirror (not shown), e.g., contained in the mirror mounts, e.g., 98A or 98B, and/or the alignment shutter from outside an OPuS enclosure without breaking the seal of the enclosure. An insertable prism may be inserted into the beam path using through the wall adjusters in order to, e.g., direct the beam out through an alignment port, e.g., to measure beam energy with a power meter head can be attached, e.g., for alignment purposes.

According to aspects of an embodiment of the disclosed subject matter certain interfaces may be used including the following. The output beam from the BAM 60 may be directed to the OPuS module 62, and the output beam from the OPuS module 62 may be directed to the autoshutter 64, with, e.g., beam line tubes (not shown) providing a purged environment for the optical transfer between the three modules. The beam may be temporarily redirected to an alignment port (not shown) which may be used for calibrating the BAM 60 power meter. The OPuS module 62 may be attached and mounted vertically to an optical table (not shown) within the laser 10 frame enclosure, which optical table may also have attached to it the output coupler 34, line narrowing module 32, MO and PRA WEBs 38, 52 and beam reverser 54. The OPuS module 62 may be positioned between the BAM 60 and the autoshutter 64. The beam line tubes, which provide the optical interface between the OPuS module 62, BAM 60, and the autoshutter 64, may also mechanically interconnect the three modules. The alignment port may have a flange that interfaces with a power meter head. The OPuS module 62 may need to be purged, e.g., with dry nitrogen to reduce the oxygen and water content of the gas within the OPuS module 62. The MO WEB 38, PRA WEB 52, BAM 60, autoshutter 64, and OPUS module 62 may be housed together in one continuous volume, with, therefore, no need for beam lines in between the modules as might be the case for separate one or more of such modules.

The design of the OPUS module 62 may assume certain values for certain characteristics of the input beam and/or the physical size and location of neighboring modules. Table II below lists some exemplary values for such parameteres.

TABLE II

| Parameter | Design Assumption |
|---|---|
| Input Pulse $T_{IS}$ | <40 nsec, and preferably ≧35 <40 (although longer pulses will produce greater output pulse lengths, the fixed delay of the OPuS can cause the magnification factor of the OPuS to decrease for pulse lengths >22 nsec) |
| Incoming Pulse Energy | 25 mJ maximum<br>18 mJ nominal |
| Wavelength | 193.25-193.45 nm |
| Repetition Rate | 1-6000 Hz |
| Incoming Horizontal Beam Size | 15.0 mm |
| Incoming Vertical Beam Size | 15.0 mm |
| Static Input Pointing Variation | ±1 mrad max, using the center of FW10% |
| Static Input Beam Position Variation | ±0.2 mm |
| Spatial Coherence | Horizontal < 50% Contrast (pin hole separation 300 micron, 8xReduction)<br>Vertical < 50% Contrast (pin hole separation 200 micron) |

According to aspects of an embodiment of the disclosed subject matter, certain parameters may be used, e.g., to identify performance requirements of an OPuS module 62. Testing against these performance requirements can be used to validate the module design. It should be noted that most of the performance requirements have been defined in terms of upper limits to the added contribution from the module 62 to the particular beam parameter, which may, e.g., be monitored under laser-operating conditions.

The below Table III may be used for OPuS Specifications.

TABLE III

| Parameter | Specification |
|---|---|
| TIS Pulse Length Magnification | XLR OPuS > 4<br>(for input pulse lengths less than 40 nsec) |
| Lifetime | >20 × 10$^9$ pulses |
| Pointing Stability | <25 μrad<br>Measured at FW10% |
| Module Dimensions | ~1750 × 125 × 250 mm |
| Leak Rate | 5 × 10$^{-5}$ sccs with a maximum pressure difference of 25 kPa |
| Beam Size | 12.0 × 12.0 ± 0.05 mm<br>Measured at FW5%. |
| Horizontal Divergence | <25 μrad<br>Measured at FW10% |
| Vertical Divergence | <25 μrad<br>Measured at FW10% |
| Horizontal Beam Symmetry | ≦5%<br>Measured at FW5% |
| Vertical Beam Symmetry | ≦5%<br>Measured at FW5% |

At least one of the imaging relay mirrors in each optical tower, e.g., e.g., 154, 158, 162, 168, 172, 176 and 180 of the first delay path 150 or 194, 195, 198 and 202 in the second delay path 190, may have orthogonal tilt adjustment accessible from outside the enclosure. For example, a 4× OPuS 62, such as described in the present application by way of example, may have eight tilt adjustments, which may be made accessible by through the wall adjusters. The TWA's can enable an operator to adjust the imaging relay mirrors or some of them, e.g., along with the Alignment Shutter without breaking the sealed nitrogen purged volume. Such adjustments may be used, e.g., in conjunction with a beam analysis tool, e.g., connected to a metrology access port of, e.g., the autoshutter. Additionally, the remaining imaging relay mirrors may have tilt adjustments accessible from only from inside the enclosure, e.g., for positioning during manufacturing or field service requiring the breaking of the purge containment, e.g., in the enclosure housing the delay path towers. The purpose of these adjustments may be, e.g., to compensate for tolerance build up of the positioning of the respective imaging relay mirror or mirrors.

The OPuS module 62 may, e.g., be capable of producing a $T_{IS}$ magnification of >2. for input pulse lengths of, e.g., less than 40 ns $T_{IS}$. The module 62 may have a first 42 nsec delay path 150 and a second 18 nsec delay. The magnification achieved will be a function of delay lengths and the beamsplitter reflectivities. The design of a dielectric beam splitter may include, e.g., a partial reflective coating on one side and an anti-reflection coating on the other. Both coatings may be designed for an angle of incidence of 45 degrees and an S polarization orientation. To reduce the effects of power induced birefringence, the coating material may be chosen to minimize absorption. The beam splitter substrate may also need to be made from a material to mitigate absorption and any lifetime concerns. A birefringence null orientation may be identified and marked on the part according to co-called "clock" the part, i.e., install it with the proper orientation.

The following Table III may be used for beam splitter specifications.

TABLE III

OPuS Dielectric Beam Splitter Specifications

| Parameter | Specification |
| --- | --- |
| Wedge Angle | <1 Arc Minute |
| Transmitted Wavefront | <λ/10 peak to valley @ 633 nm |
| Reflective Coating | 60% ± 3% for 45 degree AOI and S polarization |
| Anti-Reflective Coating | The sum of the reflection from the reflective coated side and the total transmission of the optic >98% |

An output energy of 15.0 mJ, a beam size of 12×12 mm, a throughput efficiency of 72% (4× OPuS), and a multiplication factor due to multiple round trips of 1.5, leads to a maximum expected energy density for each mirror of about 13.6 mJ/cm². The following Table V may be used for imaging relay mirror specifications.

TABLE V

OPuS IRM Specifications

| Parameter | Specification |
| --- | --- |
| Radius of Curvature | 1660 ± 1.66 mm<br>1350 ± 1.35 mm |
| Concentricity | <0.05 mm |
| Reflected Wavefront | <λ/5 Peak to Valley @ 633 nm |
| Reflective Coating | >97% at 0 degrees AOI |

A beam tube may be used to protect the beam entering the OPuS module 62 from the BAM 60. Similarly, a beam tube may be needed to seal the beam as it is outputted to the AS module 64. These beam tubes may form a mechanical interface to the other optical modules, e.g., using bellows seals. The seals between the beam tube and the module should be of vacuum quality, and proven not to out gas or deteriorate in a DUV environment. The OPuS module 62 may require purging, e.g., nitrogen ($N_2$) purging. A single purge gas input line may be divided into three lines by a manifold attached to the OPuS 64 enclosure as shown in more detail in the above referenced Ser. No. 11/805,583 co-pending patent application. There will also be two exhaust ports tubing.

Figure 6:
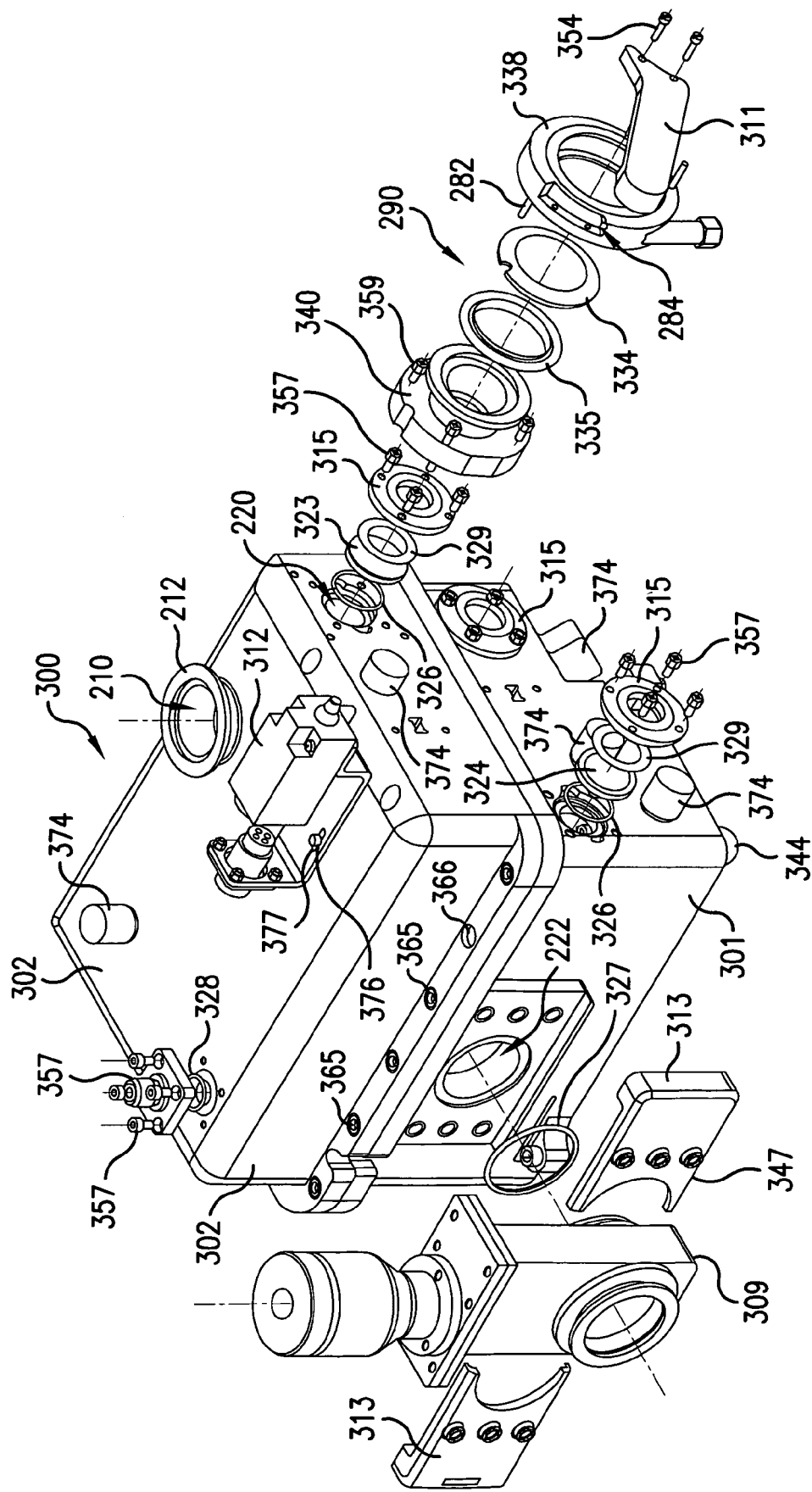
FIG. 6 shows a partly exploded perspective view of a seed laser injection system enclosure box according to aspects of an embodiment of the disclosed subject matter.

Turning now to FIGS. 6-10D there is shown a PRA WEB assembly 300 according to aspects of an embodiment of the disclosed subject matter. An example of a PRA WEB assembly 300, referring to FIG. 6, is shown illustratively to include a PRA WEB assembly box bottom 301, shown in more detail with its contents in FIGS. 8A-C, and a PRA WEB assembly box top 302, shown in more detail along with its contents in FIGS. 7A-D. As seen in FIGS. 8A, 8B and 8C the PRA WEB assembly 300 enclosure box bottom 301 may contain a turning mirror bracket assembly 304 upon which may be mounted a MO WEB turning mirror 305, a PRA WEB optics assembly 306 and an optics assembly position actuator assembly 307. The target position actuator assembly 307 may further include a target assembly position actuator translator carrier assembly 308. The PRA WEB optics assembly 306 is described in more detail in connection with FIGS. 10A, 10B and 10C.

Figure 9B:
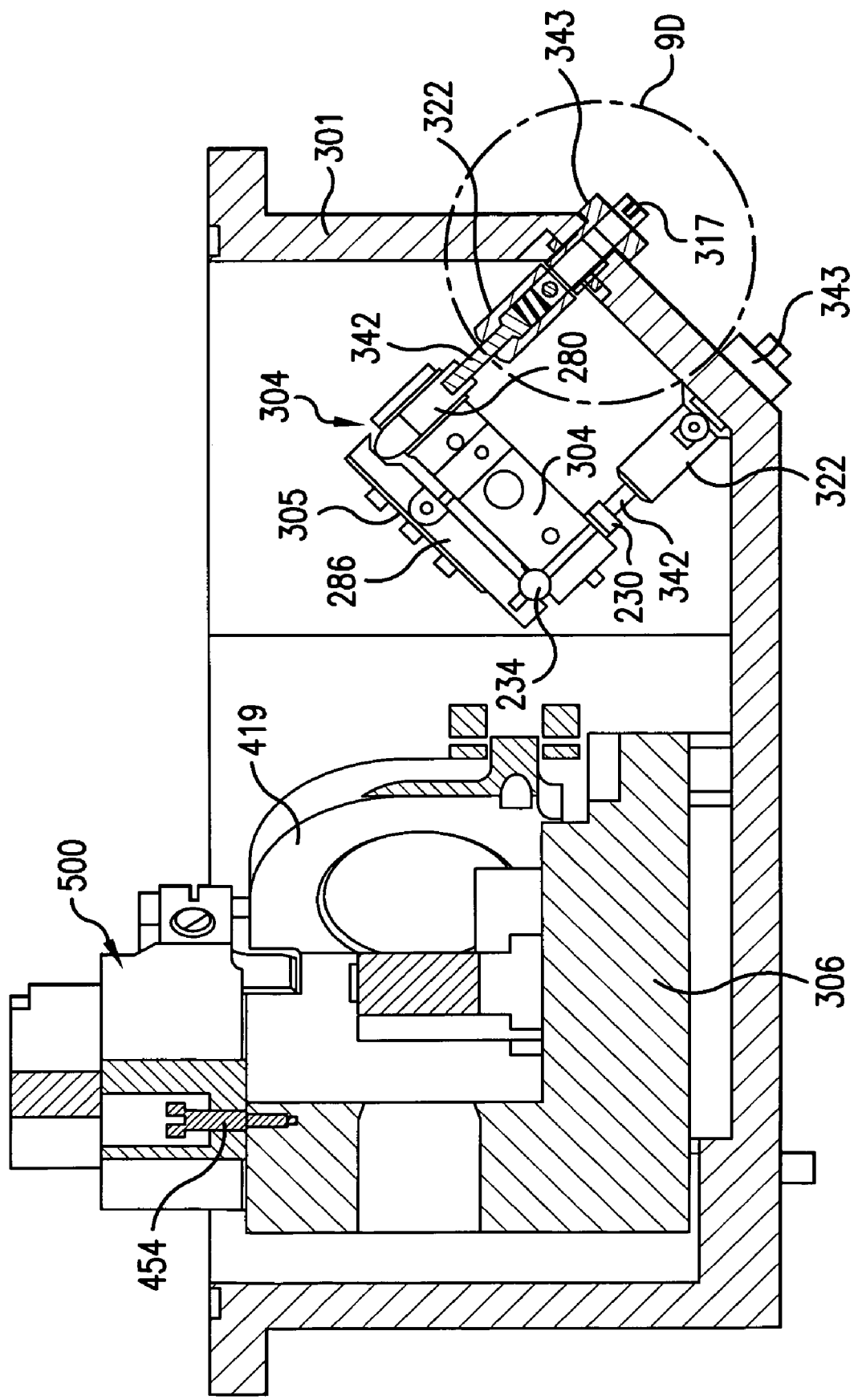
Figure 9C:
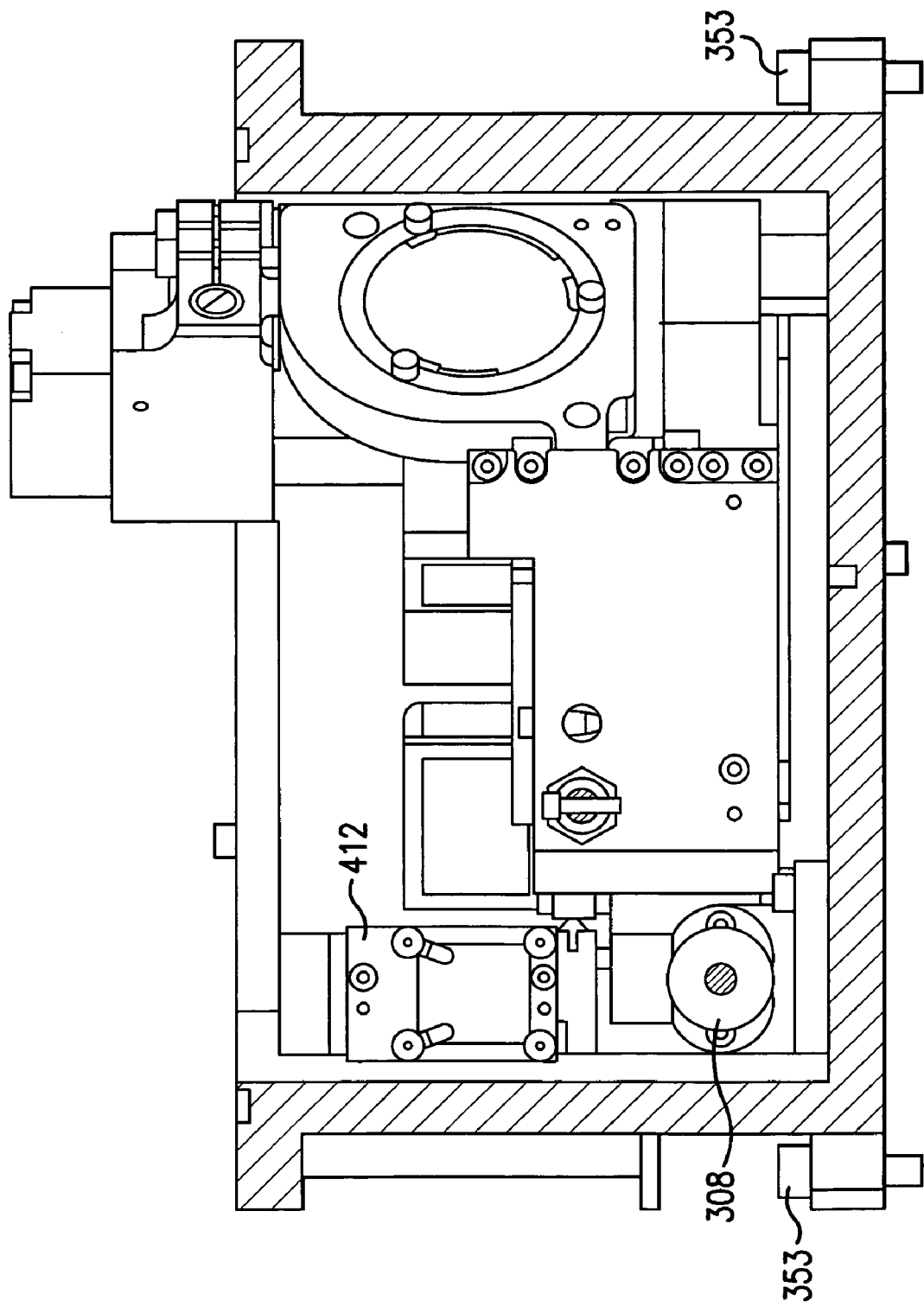
Figure 9D:
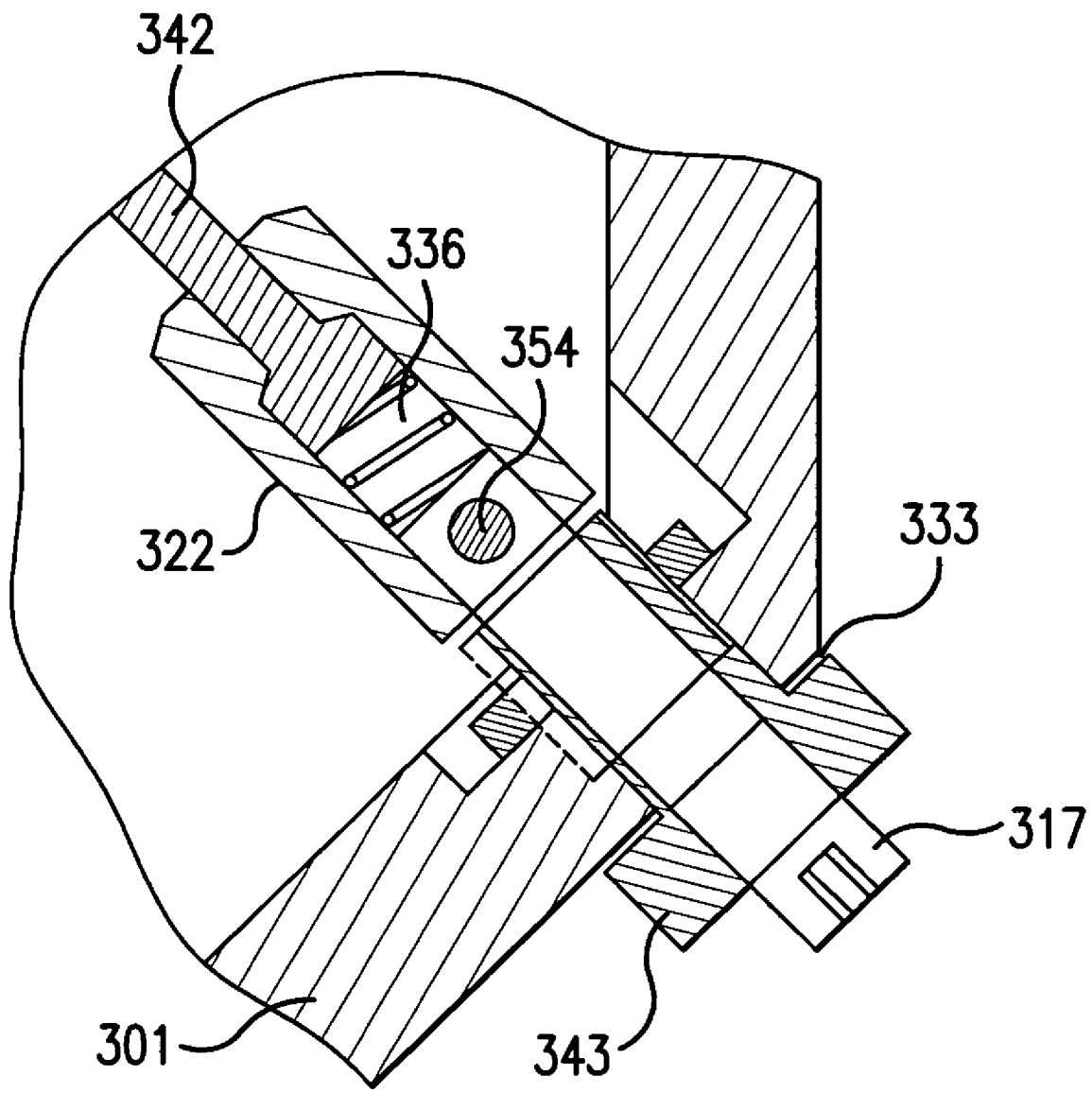

The PRA WEB turning mirror bracket assembly 304 may include, e.g., a through the wall adjuster ("TWA") 322, which may include a pair of through-the-wall adjuster hexagonal plungers 342 and a pair of stainless steel wire compression springs 336, cooperating with a respective one of a pair of adjustment screws 317, each connected to an external adjustment bushing 343 and gasket 333, which plungers 342 may be held in place against the spring action of springs 336 by a neck on a respective adjuster assembly 322. The adjusters 322 may be held in place to the respective adjustment screw 317 by a respective stainless steel socket head captive screw 354. The plungers 342 may be held in place in a respective turning mirror adjustment set screw 230 connected to the bracket assembly 304 by a captive screw 232. The bracket assembly 304 may be held in place in the PRA WEB box bottom 301 by a pair of stainless steel socket head captive screws 363. The set screws 230 may be connected to the turning mirror 286 at opposing corners. In operation, as shown in FIGS. 9B and 9D, the rotation of either of the adjustment screws 317 can move the turning mirror 305 mount plate 286 to move the folding mirror 305 in a tilt around pivot ball 234 to tilt the turning mirror 305 in either or both of two orthogonal axes.

The PRA WEB assembly box top 302 may also include a cover purge shield 339 held in place on the ceiling of the box top 302 by a plurality of stainless steel socket head cap screw 352.

A stainless steel manual gate valve 309, such as an 11000 series valve such as a QF 40 made by HVA, LLC, of Reno, Nev., e.g., with a seal 327, as shown in FIG. 6, may be attached to the outside of the PRA WEB box bottom 301, e.g., by a pair of gate valve half clamps 313, attached to the box bottom 301 outer wall by a plurality of socket cap screws 347.

Figure 7A:
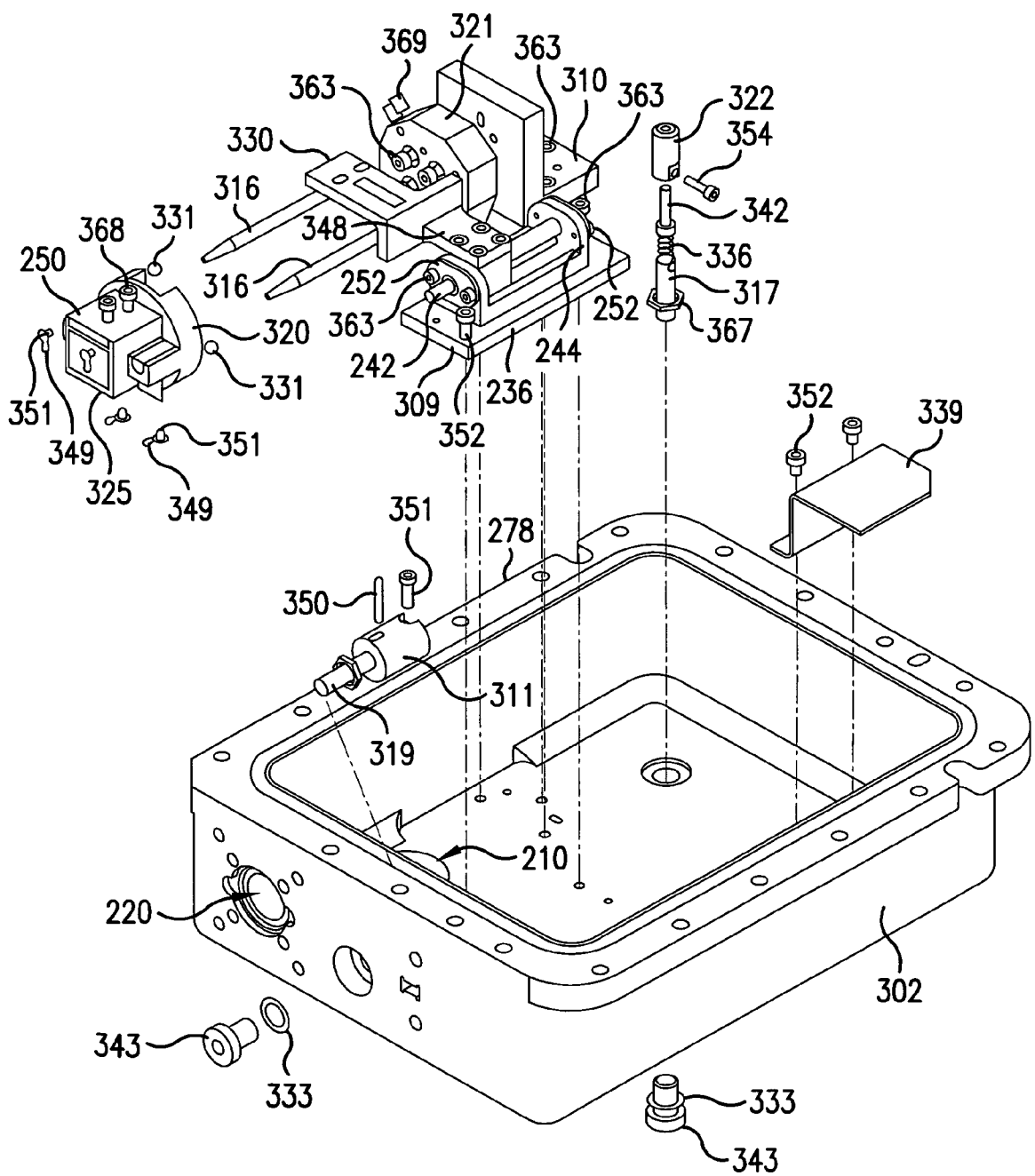
FIGS. 7A, 7B, 7C and 7D show, respectively an exploded perspective view, a bottom plan view, a cross sectional view and a detailed view of a seed laser injection system enclosure box top and its contents according to aspects of an embodiment of the disclosed subject matter.
Figure 7B:
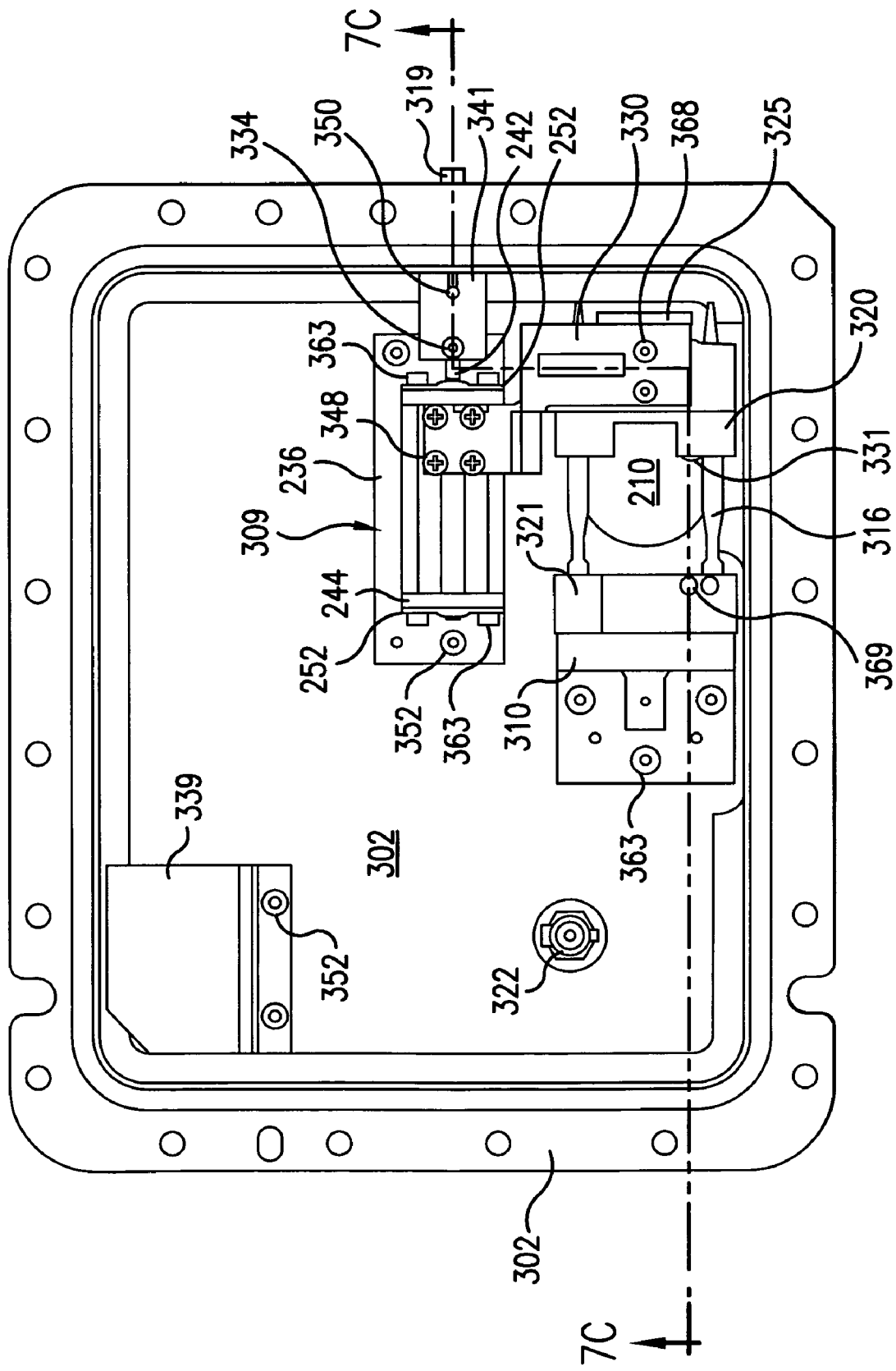
Figure 7C:
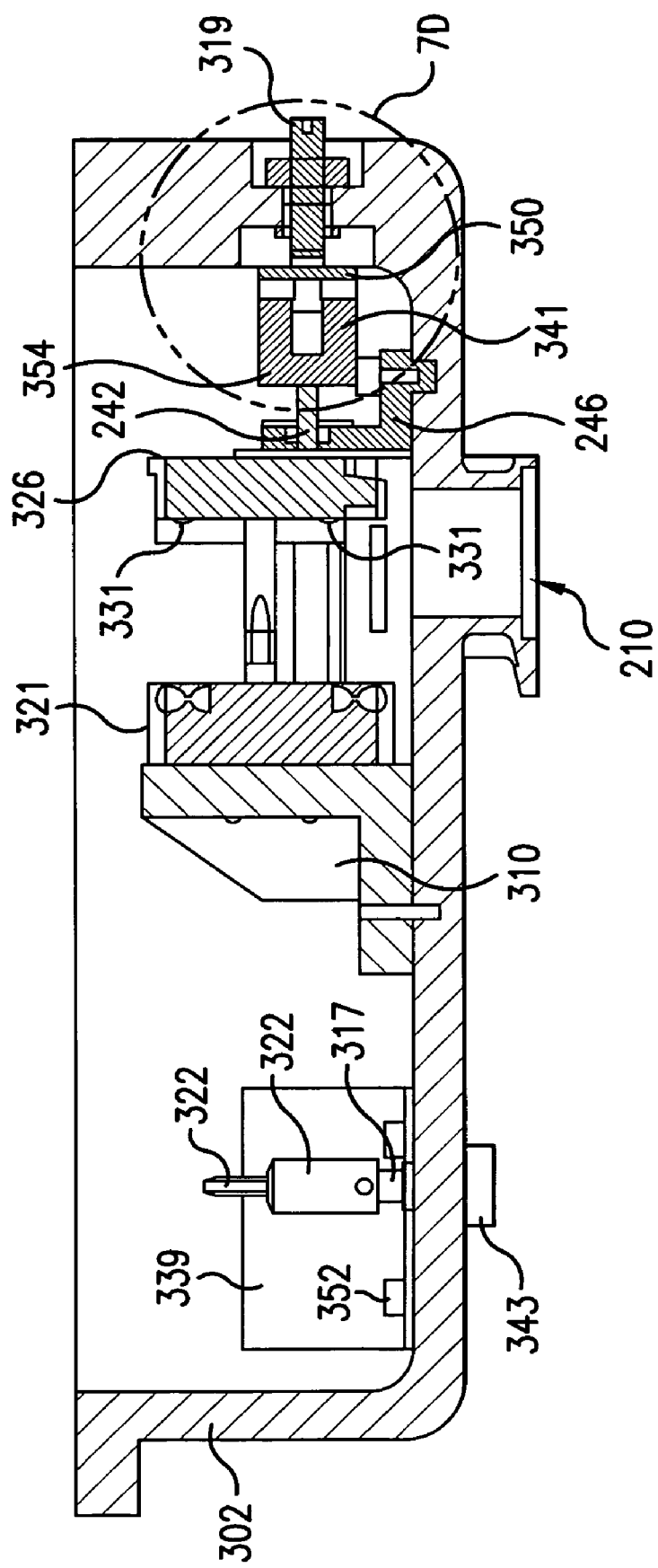
Figure 7D:
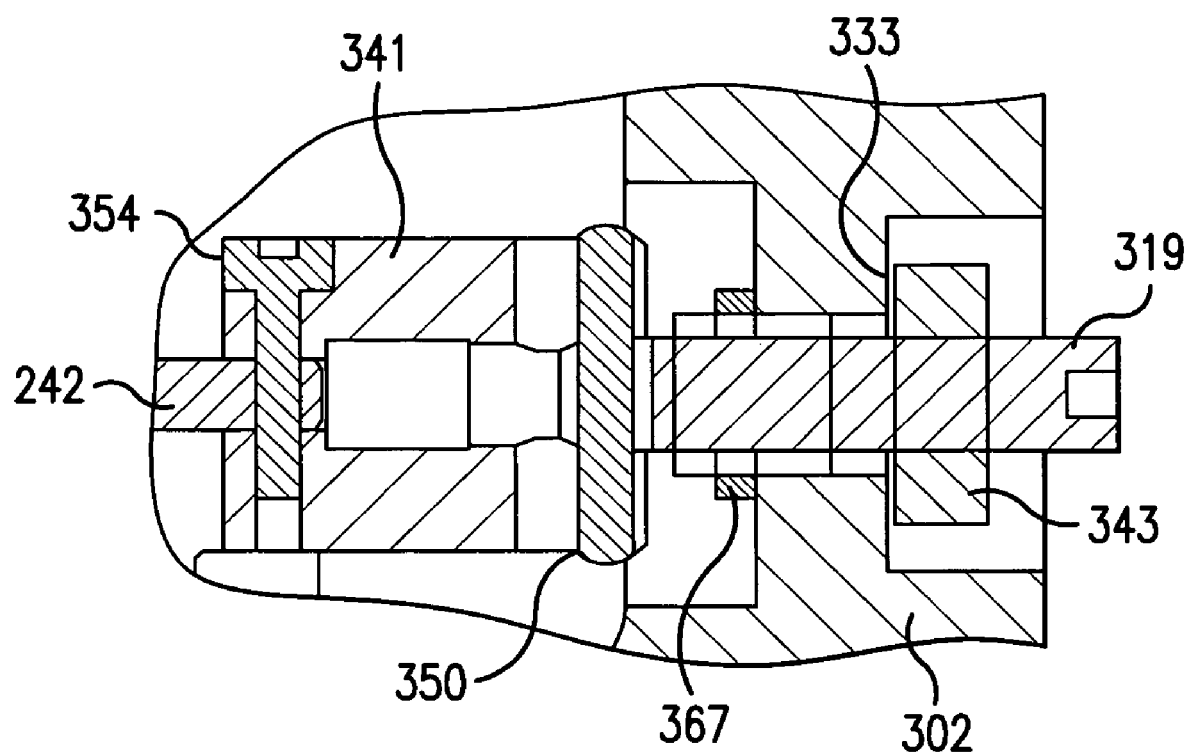
Figure 8A:
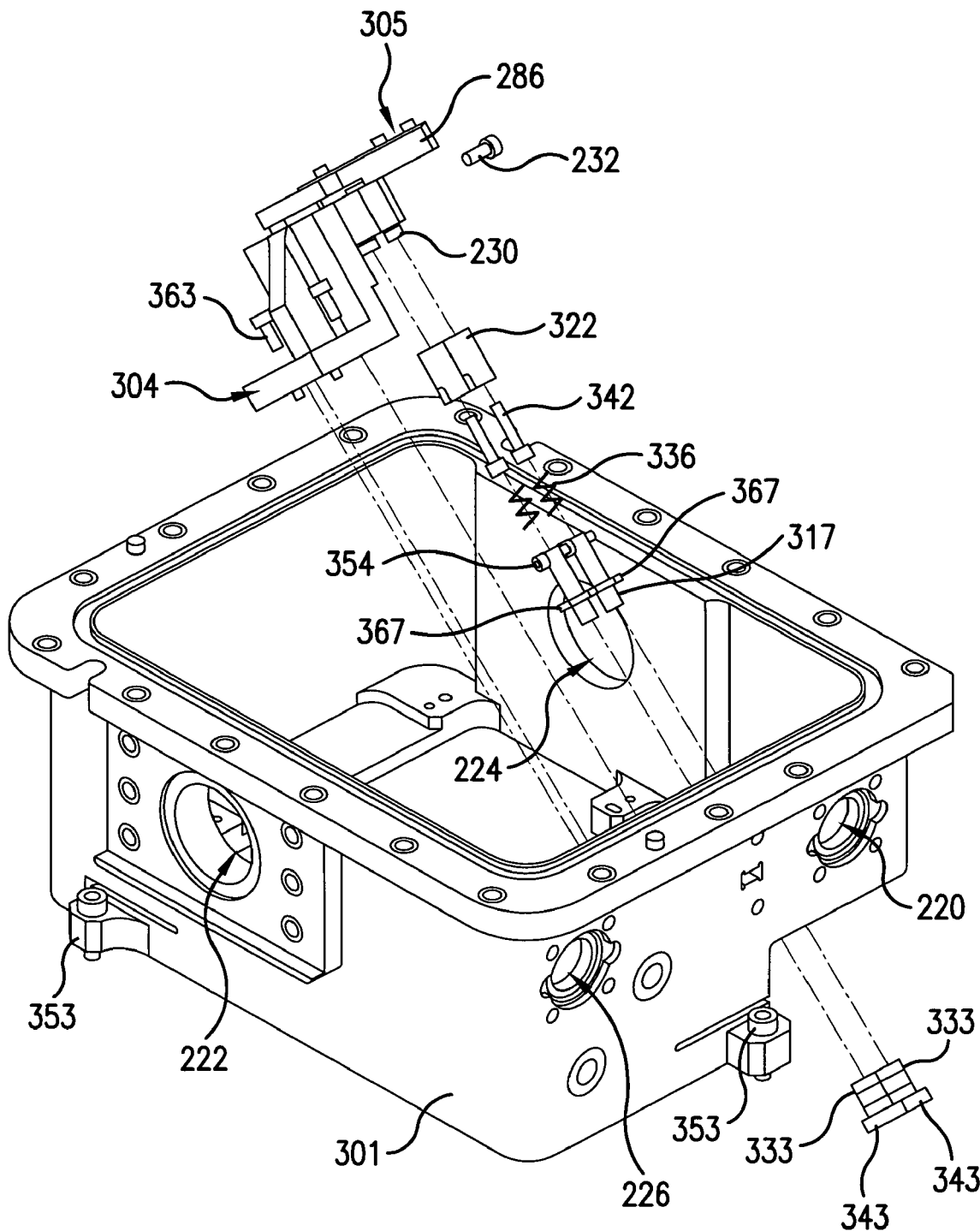
FIGS. 8A, 8B and 8C show, respectively an first and second exploded perspective view and a cut-away portion of an exploded perspective view of a seed laser injection system enclosure box bottom and its contents according to aspects of an embodiment of the disclosed subject matter.
Figure 8B:
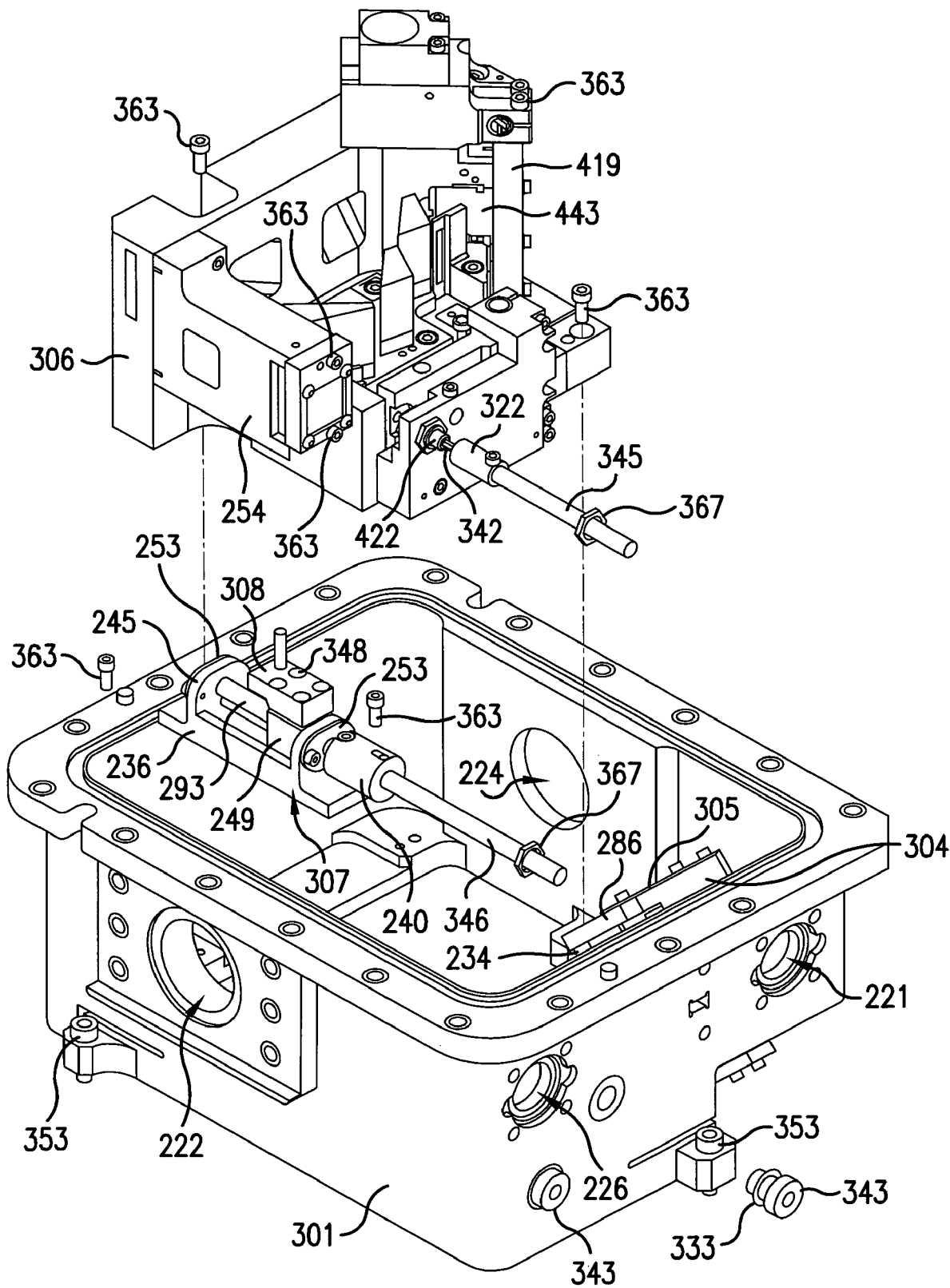
Figure 10A:
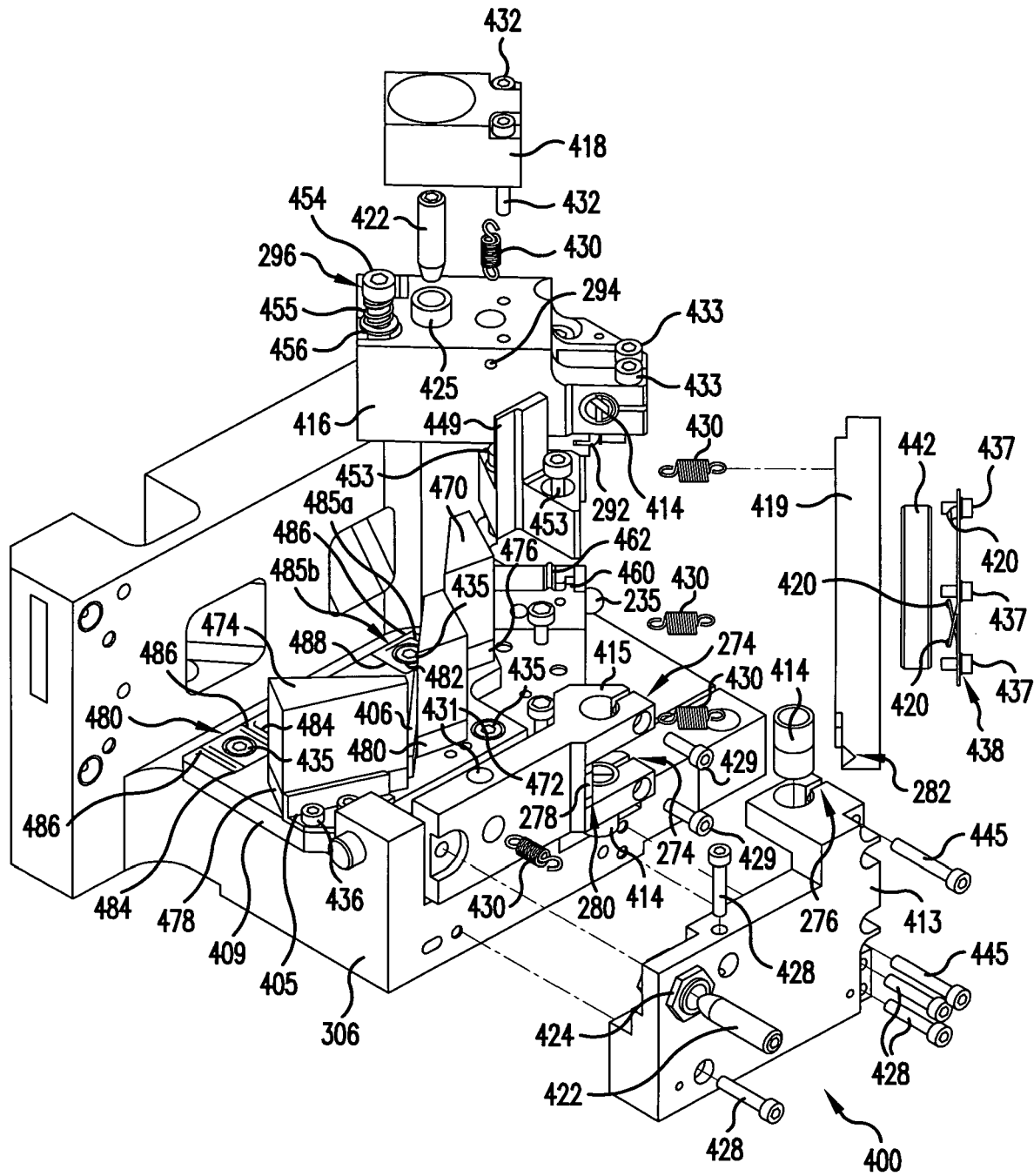
FIGS. 10A, 10B, 10C and 10D show, respectively a first second and third partly exploded perspective view and a detailed view of an optics assembly according to aspects of an embodiment of the disclosed subject matter.
Figure 10B:
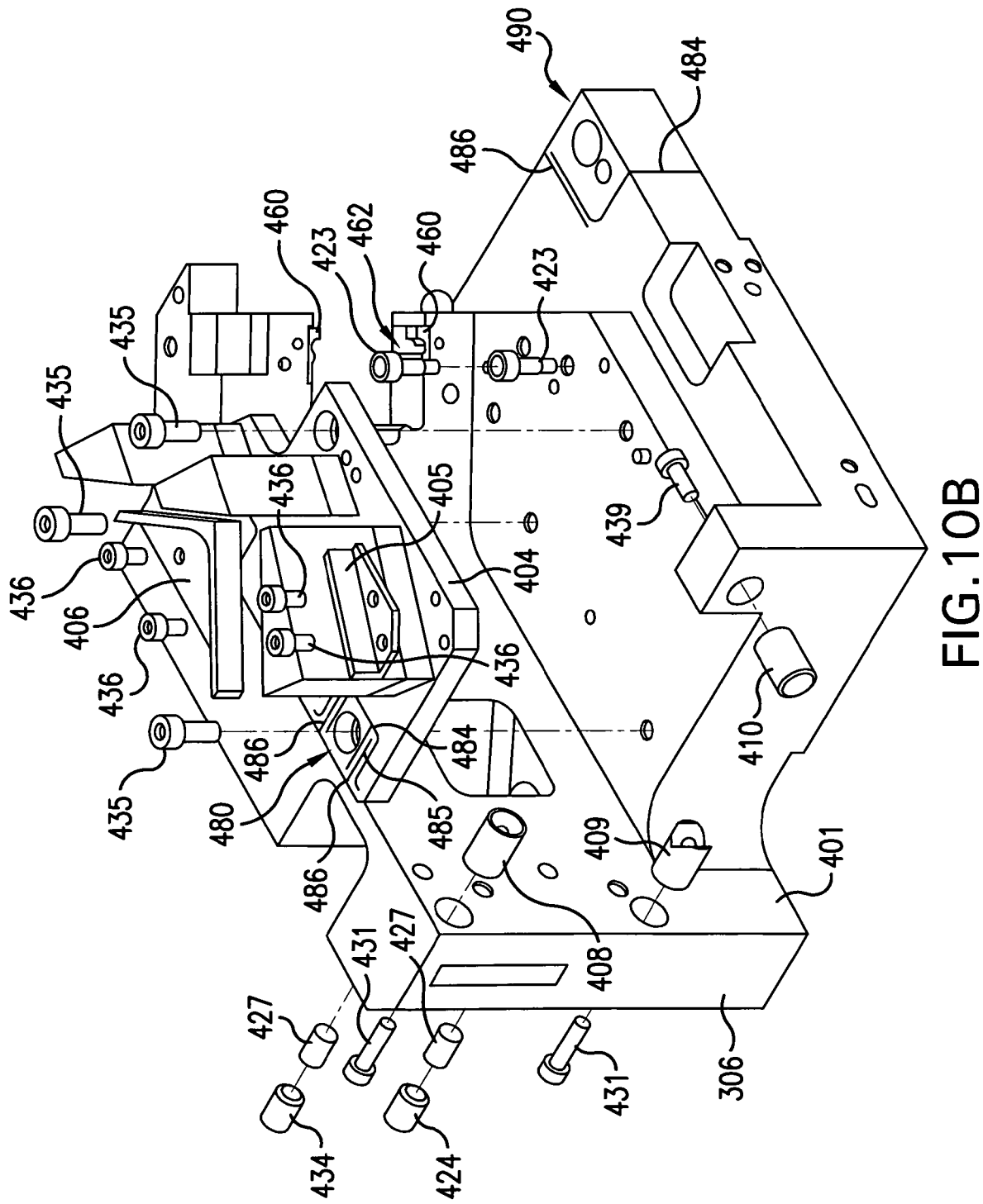
Figure 10C:
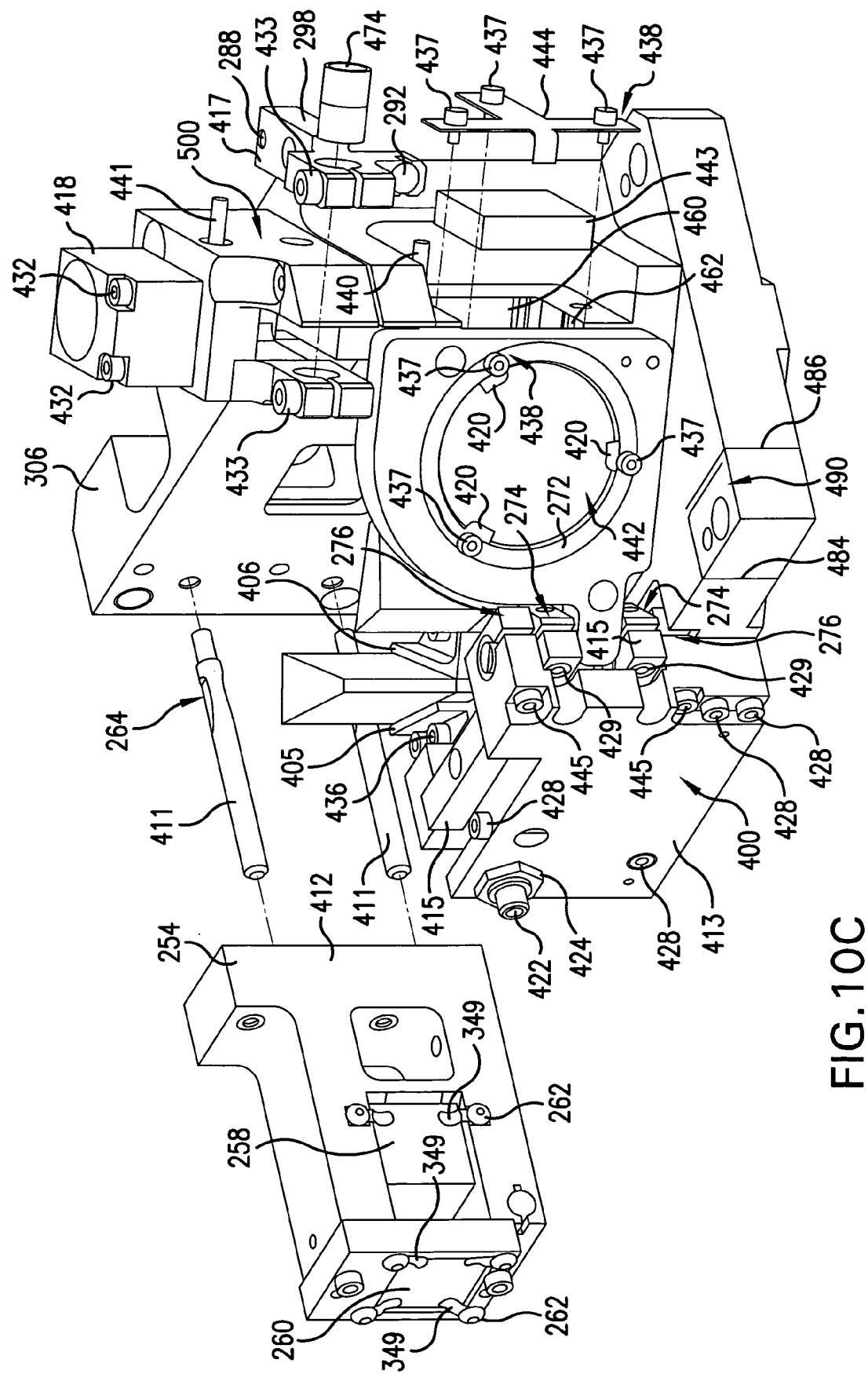
Figure 10D:
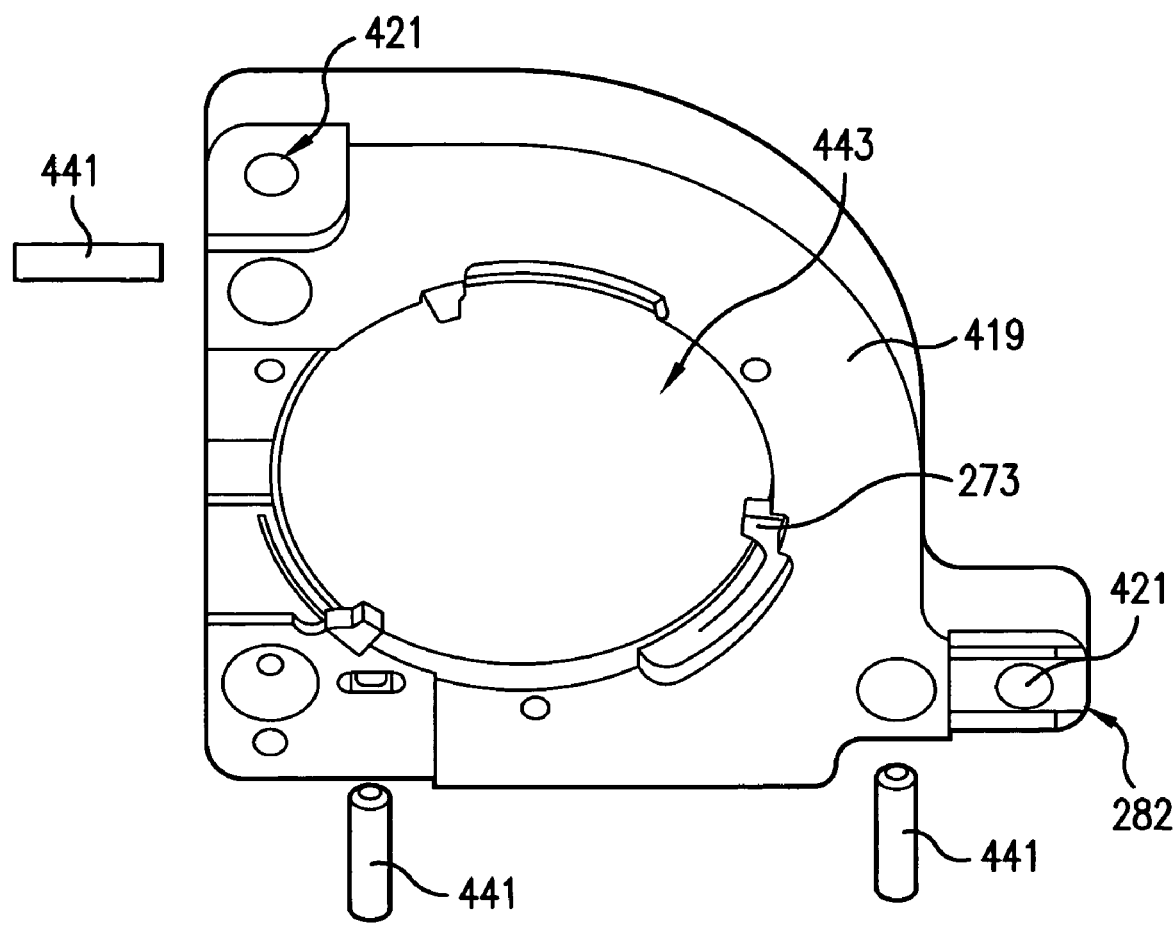

FIG. 7D illustrates the through the wall adjustment screw 319 for the MO WEB input alignment target prism position actuator assembly 309, similar to that shown in FIG. 8B for the adjustment screw 346 for the target prism adjustment assembly 307 and 345 for the output coupler horizontal adjustment assembly 400 discussed in more detail with regard to FIGS. 10A, 10B and 10C, which adjustment screw 319 may extend through bushing 343 and washer 333, which bushing 343 may be held in place by a flat brass hex nut 367. As illustrated, the adjustment screw 319 may be held in the helical AT 341 by a stainless steel dowel pin 350 and the opposing end of the helical AT 341 may have attached to it an adjustment screw 242, which may be attached by a stainless steel socket head captive screw 354. The adjustment screw 242 may be held by a pair or radial bearings on a cradle 244 mounted on a prism alignment assembly base plate 236. The adjustment screw 242 may threadingly engage a traveling block 248 within the cradle 244 and the traveling block may be attached by stainless steel phillips flat head machined screw 348 to a prism assembly positioning translator carrier 330, which may travel on a pair of alignment tool prism positioning shafts 316. A prism assembly mount 320 may be moved along the shafts 317 by the translator carrier 330 and may have attached to it a prism mounting bracket 250, to which may be attached an alignment prism such as a 25 mm, UV grade fused silica right triangle prism 325, by a pair of stainless steel socket head shoulder screws 368 and optical mirror mounting clips 349 attached to the prism mount 250 by stainless steel socket head captive screws 351. The alignment shafts 316 may extend from an interface assembly mount 321, which may be attached to the bracket 310 by stainless steel socket head captive screws 363, which screws 363 may also be used to attach face plates 252 to the cradle 244 and to attach the prism guide bracket 310 and the translator adjustment screw cradle base plate 236 to the ceiling of the PRA WEB assembly box top 302. Stainless steel precision ground balls 331 mounted in recesses in the prism assembly mount 320 may serve to seat in a repeatableprism assembly "alignment" position.

As shown by way of example in FIG. 8B a target prism position actuator assembly 307 may include, e.g., a base plate 236 and a cradle 245 attached to the base plate 236. A helical AT 240, similar to that shown in more detail as 341 in FIG. 7D, along with an adjustment screw 346 which extends through the wall through a bushing 343 and washer 333 shown in FIG. 8B and similar to that shown in more detail in FIG. 7D. A PRA WEB target assembly mounting bracket 254 may abut the optics assembly 306 when in position and may also be connected to target assembly positioning actuator assembly 307 by a dowel pin 256, for movement with the actuator assembly 307. The cradle 245 may have an associated face plates 253 and the adjustment screw 243 contained in the cradle 245 by radial bearings for rotational motion to move a traveling block 249 to which may be attached the actuator assembly 308.

As shown in more detail in the exploded view of FIGS. 10B and 10C by way of example, the target mounting block 254 may travel on a pair of PRA WEB target travel alignment shafts 411, which may be attached to the optic mounting block 306 by a precision land conic foot 408 on the one hand and a precision land foot slotted foot 409 on the other hand, and connected by a respective one of a pair of stainless steel socket head captive screws 431. A brass adjustment screw nut 424 threaded on the respective screw 431 may hold a respective magnet 427 inside a sleeve formed by the respective foot 408, 409. The respective magnets may serve to minize any error in the force applied to seat the prism assembly to its "alignment" position.

The target alignment prism mount assembly mounting block 254 may be limited in travel along the rods 411 by travel stop notches 264, which may be used to adjust the alignment target prism 258 when in place and which may be adjusted in position by the use of the screws 431 and the feet 408 and 409.

The optical mount 306 may be attached to the floor of the PRA WEB assembly box bottom 301 by stainless steel screws 270, similar to screws 363, two of which may be used in association with a respective one of a pair of flexured mountings 490, 492. The flexured mounts may each have a straight groove 486 and a multiple leg groove 486 which form between them a thin flexure arm 485 giving the optic mount flexibility to move with respect to the screw 270 in a direction perpendicular to the longitudinal axis of the thin arm 485, while being relatively more stiff in the orthogonal axis, e.g., to account for differential thermal expansion of the box bottom 301 and the optic mount 306.

A Zr—Cu PRA WEB optics assembly mount 401 may include, e.g., a beam expansion optics prism assembly mount 404, which mounting plate 404 may be attached to the optics mount 306 in a suitably sized and shaped alcove by a plurality of stainless steel screws 270 similar to screws 363, at least two of which may be utilized in association with a respective one of a pair of flexured mounts 480, 482. The flexured mount 480 may be formed by a pair of straight slots 486 through the mounting plate 404 and a plurality of surrounding slots 484 forming between then two pairs of flexured arms 485 which give the mounting plate some flexibility of movement in a direction perpendicular to the flexured arms 485. The flexured mount 482.may, e.g., include a straight slot 486 similar to as is illustrated for flexured mounting 480 and a multi-legged slot 488, shown in more detail in FIGS. 9a and 10A, which together with the straight slot 484 and the rest of the mounting plate 404 form two generally orthogonal flexure arms 485a, 485b, giving the mounting plate 404 some flexibility of movement both perpendicular to the first flexure arm 485a and to the second flexure arm 485b relative to the respective stainless steel socket head captive mounting screws 435.

Mounted to the beam expanding optics mounting plate 404, as shown, e.g., in FIGS. 10A, 10B and 10C may be a first beam expander prism first half 470, a second beam expander prism 472, and a first beam expander prism second half 474, each attached to the mounting plate 404 by a respective first beam expander prism first half mounting member 476, a second beam expander prism mounting member 478, and a first beam expander prism second half mounting member 480, each of which may be glued to the mounting plate 404 and the respective beam expanding prism 470, 472 and 474. The operation of the beam expander prisms is explained in more detail in the above referenced co-pending Ser. No. 11/787,180 application. The respective prisms 472, 474 may be held in place and aligned with each other also, e.g., by brackets scatter shields 405, 406 which may be attached to the mounting plate 404 by stainless steel socket head captive screws 436.

An output coupler horizontal adjustment assembly 400, shown, e.g., in FIGS. 10A and 10B, may serve to rotate the output coupler mount 419 around a horizontal axis, denominated a horizontal axis vis a vis the illustration in FIGS. 10A, 10B and 10C, for convenience of disclosure and by way of example only and need not be aligned with horizontal in use, which mount 419 may contain a Zr—Cu PRA WEB output coupler mount 419 in an output coupler opening 443. A PRA WEB light shield 449 may be mounted on the mounting plate 404 by a pair of stainless steel socket head captive screws 453. The output coupler horizontal adjustment assembly 400 may include a Zr—Cu PRA WEB horizontal mount assembly front plate 413, which may be attached to the optic mount 306 by a plurality of stainless steel socket head captive screws

428. A stainless steel single ended flexural pivot upper bearing 414, such as a C-Flex bearing made by Bearing Co. Inc., of Frankfort N.Y., may attach a Zr—Cu PRA WEB horizontal adjust lever assembly 415 to the front plate 413 for rotation on the bearing 414 about a vertical axis and with respect to the stationary front plate 413. The bearing 414 may be held in place by a stainless steel socket head cap screw 429 tightening an upper clamp 274 on the lever portion 415 and may be held in place with respect to the front plate 413 by a stainless steel socket head cap screw 429 tightening an upper clamp 276 on the front plate 413. A lower stainless steel single ended flexural pivot bearing 414 may hold the lever assembly 415 for rotation about a vertical axis with respect to the bearing and the front plate 413. The upper bearing 414 may be held in place with respect to the lever assembly 415 by a for rotation about the bearing 414 with respect to the front plate 413 and held in place by a stainless steel socket head cap screw 429 tightening a lower clamp 274 on the lever portion 415 and may be held in place with respect to the front plate 413 by a stainless steel socket head cap screw 429 tightening a lower clamp 276 on the front plate 413. In an opening between the clamps 274 may be formed a ridge 278 with a truncated triangular extension 280, which may engage a similar triangular groove 282 on the output coupler mount 419 and hold in compression between the ridge 278 and the groove 282 a precision ground stainless steel pivot ball (not shown).

The through the wall adjuster screw 345 may be held in place on an adjuster 322 by a screw 354. A hexagonal plunger 342 may engage a hexagonal female opening in a set screw 422, such that rotation of the through the wall adjuster screw 345 rotates the set screw 422 and the set screw ball end moves the lever assembly 415 against the spring pressure of spring 430 between the front plate 413 and lever assembly 415. This pivots the end of the lever assembly 415 around the bearings 414 to apply force in a generally horizontal plane to the output coupler mount 419 through the ball (not shown) interacting with the mount 419 in the groove 282

The output coupler horizontal adjustment assembly may include, e.g., a through the wall actuator assembly shown, e.g., in FIG. 7a within the PRA WEB assembly box top 302 and having an adjustment screw 317 extending through the ceiling of the PRA WEB assembly box top 302 into a bushing 343 and washer 333, with a locking nut 367 internal to the box top 302. As with the other illustrated through the wall adjustment screws, e.g., 319, 345, 346 the adjustment screw is associated with a through the wall adjuster 322, housing a plunger 342 and a compression spring 336 and is held in place on the adjustment screw 317 by a screw 354. The plunger 342 may engage a set screw 422 passing through a brass set screw adjustment nut 425 in an output coupler vertical adjustment assembly 500, to engage a vertical adjust recess in a vertical adjust lever 417. The vertical adjust lever 417 may be held for rotational movement about a flex bearing 414 held in clamps on the vertical adjust assembly 500 by stainless steel socket head cap screw 433. Rotation of the lever 417 about the bearing 414 applies force to the output coupler mount 419 against the spring pressure of springs 430 connected between the output coupler mount 419 and the optics assembly 306, to rotate the output coupler mount 419 about the pivot ball (not shown) engaging the slot 282 on the output coupler mount 419 around a horizontal axis.

The output coupler may be held in the output coupler opening 443 in the mount 419 by an plurality of optic spring clips 420 on an optic spring clip ring 272 opposing a plurality of output coupler 442 optic holding members 473 on the mount 419 and extending into the opening 443. A plurality of springs 430, e.g., three springs 430 may be held in place on the output coupler mount 419 by one of a respective plurality of stainless steel flat point socket hex set screws 441, two of which may be held in place relative to the mounting plate by a respective one of a pair of stainless steel socket shoulder screws 423 and one of which may be held in place in relation to the optic mount by a stainless steel flat point socket hex set screws 440. The output coupler 442 may be a $CaF_2$ 193 nm 20% reflective 45° clocked output coupler 442.

The output coupler vertical adjust assembly 500 may be attached to the optical assembly 306 by an attachment assembly 296, which may consist of, e.g., a stainless steel shoulder socket screw 454 a flat washer 456 and a stainless steel wire compression spring 455. A Zr—Cu PRA WEB vertical adjust guide 418 may be attached to the vertical adjust assembly 500 by a pair of screws 432. A spring 430 may be connected to the vertical adjust assembly 500 by a pin inserted in dowel pin hole 294 and to the lever assembly 417 by a dowel pin inserted into dowel pin hole 298.

Figure 8C:
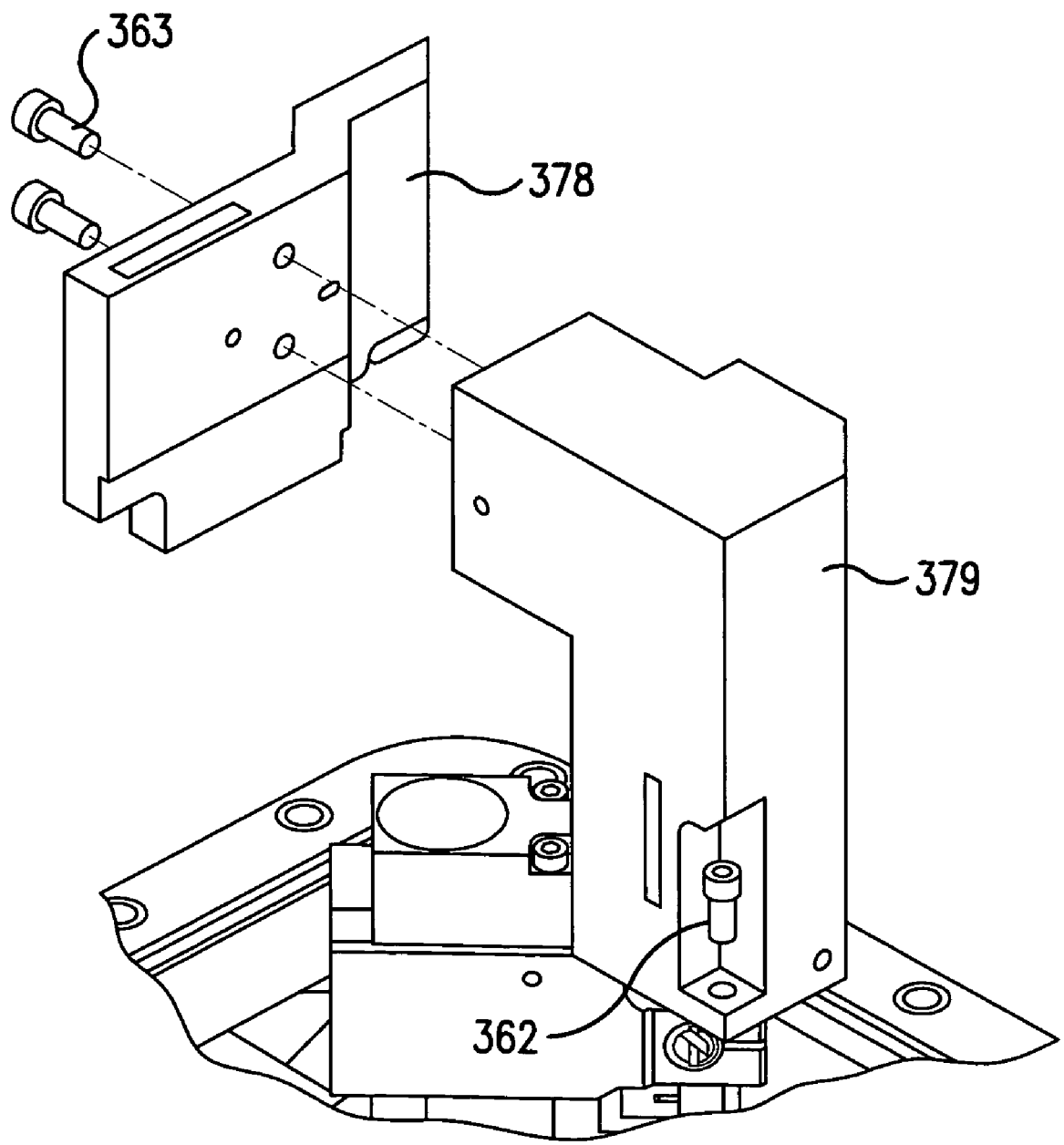

An $R_{MAX}$ mirror 443, e.g., highly reflective p polarized $CaF_2$ 45° $R_{MAX}$ mirror 443 may be held in place in an $R_{MAX}$ opening by a spring clip 444, which may be attached to the optics assembly 306 by a plurality of stainless steel socket head cap screws 439 and stainless steel split lock washers 438. A heat sink (not shown) may be attached to a heat sink mounting member 379, e.g., as shown in FIG. 8C to be attachable to the floor of the box bottom 301 by a plurality (only one shown) of screws 363. The heat sink mount 379 may also have attached to it a light shield 378 by a plurality of screws 363.

As seen by way of example in FIG. 6. an alignment window interlock assembly 290, for the alignment opening 220, may include, e.g., a 30 mm round×4 mm thick $CaF_2$ window 323 and an external pressure c-seal 326 and a foil ring 329 held in place in the opening 220 by a window clamp 315 and socket head captive screws 357. A window clamp 340 with a cover flange may be held in place over the window clamp 315 by steel socket head captive screws 359 and a centering ring assembly 335 and a clocked cover 334 may be held in place on an annular flange on the flanged mount assembly 340 by a clocked assembly clamp 338, with a pin dowel pin 282 aligning the clamp 338 to the clocked grooves on the clamp 340 and the cover 334 such that the interlock paddle 311, which inserted into an interlock paddle slot 284 on the cover assembly clamp 338, and held in place there by screws 354, will engage a limit switch actuator on a LAM interlock assembly 312 held on the outside of the PRA WEB assembly box top 302 by stainless steel socket head captive screws 376 and associated washers 377.

Also seen in FIG. 6 is another alignment window assembly with a window clamp 315, without a cover plate or interlock, for the opening 221 for aligning the output coupler 442 and an exploded view of another window assembly, without a cover plate or interlock for the opening 226, used with the alignment target prism 258. Knobs 374, with internal fittings (not shown) to interface with a respective through the wall adjustment screw 317, 319, 345, 346 may be used for adjustment rotation of the respective adjustment screw 317, 319, 345, 346. Bellows assemblies (not shown) may connect the PRA WEB assembly 300 to the amplifier section of the laser system, the power ring amplifier ("PRA") chamber 50 at the gate valve 309, and to the PRA WEB output to the BAM 60 through opening 224 and the PRA WEB 300 input from the oscillator section 12 of the laser system 10, through opening 210.

It will be understood by those skilled in the art that, according to aspects of an embodiment of the disclosed subject matter, an apparatus and method are disclosed which may comprise a pulsed gas discharge laser lithography light source, among other purposes, such as an excimer laser such as an ArF, KrF laser or an $F_2$ molecular laser, which may comprise a seed laser portion, e.g., a master oscillator, providing a seed laser output light beam of seed pulses; an amplifier portion, such as a ring power amplifier, as discussed in the above referenced co-pending Ser. No. 11/787,180 patent application, receiving the seed laser output light beam and amplifying the optical intensity of each seed pulse to provide a high power laser system output light beam of output pulses, e.g., at ninety or more Watts and at or above 4 kHz, preferably at or about 6 kHz, e.g., as may be necessary and required for current and future generations of immersion lithography while maintaining the economics of non-immersion state of the art lithography processes, e.g., with respect to throughput, beam quality parameters, dose and dose stability and the like requirements; a pulse stretcher increasing the number of peaks in the output pulse and decreasing the average peak intensity of each of the output pulses by passing the output pulses through a pair of optical delay paths in series; the pulse stretcher may comprise: a first beam splitter operatively connected with the first delay path and a second pulse stretcher operatively connected with the second delay path; a first optical delay path tower containing the first beam splitter, e.g. made up of a pair of mirror mounts holding, e.g., imaging relay mirrors for the first delay path in an enclosure with the first beam splitter including a beam splitter enclosure box and two end boxes; a second optical delay path tower containing the second beam splitter, e.g., also within the enclosure and, e.g., in the box housing the first beam splitter and, e.g., also a pair of mirror mounts holding, e.g., imaging relay mirrors and contained in the respective end boxes; one of the first and second optical delay paths may comprise: a plurality of mirrors defining the respective optical delay path including mirrors located in the first tower and in the second tower; the other of the first and second optical delay paths may comprise: a plurality of mirrors defining the respective optical delay path including mirrors only in one of the first tower and the second tower. The first optical delay path and the second optical delay path may be of unequal length. The first optical delay path may be longer than the second optical delay path. The other of the first and second optical delay towers containing mirrors in both of the first and second towers may be the longer of the first and second optical delay paths. The longer of the first and second optical delay paths may be the first optical delay path in the series arrangement. The mirrors may comprise imaging mirrors and/or confocal mirrors.

Those skilled in the art will understand that, according to aspects of an embodiment of the disclosed subject matter, an apparatus and method are disclosed which may comprise a pulsed gas discharge laser lithography light source, such as noted above, for immersion lithography uses, among other purposes, which may comprise a seed laser portion providing a seed laser output light beam of seed pulses; an amplifier portion, e.g., as noted above, receiving the seed laser output light beam and amplifying the optical intensity of each seed pulse to provide a high power laser system output light beam of output pulses, such as is discussed above; the amplifier portion may comprise a ring power amplifier which may comprise amplifier portion injection optics which may comprise at least one beam expanding prism, a beam reverser and an input/output coupler; the beam expansion optics and the output coupler may be mounted on an optics assembly with the beam expansion optics rigidly mounted with respect to the optics assembly and the input/output coupler mounted for relative movement with respect to the optics assembly for optical alignment purposes. The input/output coupler may be mounted for movement with respect to the optic assembly in a first axis and a second axis. The first axis and second axis may be generally orthogonal to each other. The amplifier injection optics may be contained within an amplifier portion injection optics assembly box and the input/output coupler may comprise at least one through-the-wall adjusting actuator to adjust the position of the input/output coupler in at least one axis.

It will be understood by those skilled in the art that the aspects of embodiments of the disclosed subject matter are intended to be possible embodiments or portions of possible embodiments only and not to limit the disclosure of the disclosed subject matter in any way and particularly not to a specific possible embodiment or portion of a possible embodiment alone. Many changes and modification can be made to the disclosed aspects of embodiments of the disclosed subject matter that will be understood and appreciated by those skilled in the art. The appended claims are intended in scope and meaning to cover not only the disclosed aspects of embodiments of the disclosed subject matter but also such equivalents and other modifications and changes that would be or become apparent to those skilled in the art. In addition to changes and modifications to the disclosed and claimed aspects of embodiments of the disclosed subject matter others could be implemented.

While the particular aspects of the embodiment(s) of the IMMERSION LITHOGRAPHY LASER LIGHT SOURCE WITH PULSE STRETCHER described and illustrated in this patent application in the detail required to satisfy 35 U.S.C. §112 are fully capable of attaining any above-described purposes for, problems to be solved by, or any other reasons for or objects of the aspects of an embodiment(s) above described, it is to be understood by those skilled in the art that presently described aspects of the described embodiment(s) of the disclosed subject matter are merely exemplary, illustrative and representative of the subject matter which is broadly contemplated by the disclosed subject matter. The scope of the presently described and claimed aspects of embodiments or portions of embodiments fully encompasses other embodiments or portions of embodiments which may now be or may become obvious to those skilled in the art based on the teachings of the Specification. The scope of the present IMMERSION LITHOGRAPHY LASER LIGHT SOURCE WITH PULSE STRETCHER is solely and completely limited by only the appended claims and nothing beyond the recitations of the appended claims. Reference to an element in any such claim in the singular is not intended to mean nor shall it mean in interpreting such claim element "one and only one" unless explicitly so stated, but rather "one or more". All structural and functional equivalents to any of the elements of the above-described aspects of an embodiment(s) that are known or later come to be known to those of ordinary skill in the art are expressly incorporated herein by reference and are intended to be encompassed by the present claims. Any term used in the Specification and/or in the claims and expressly given a meaning in the Specification and/or claims in the present application shall have that meaning, regardless of any dictionary or other commonly used meaning for such a term. It is not intended or necessary for a device or method discussed in the Specification as any aspect of an embodiment or portion of an embodiment to address each and every problem sought to be solved by the aspects of embodiments or portions of embodiments disclosed in this application, for it to be encompassed by the present claims. No element, component, or method step in the present disclosure is intended to be dedicated to the public regardless of whether the element, component, or method step is explicitly recited in the claims. No claim element in the appended claims is to be construed under the provisions of 35 U.S.C. §112, sixth paragraph, unless the element is expressly recited using the phrase "means for" or, in the case of a method claim, the element is recited as a "step" instead of an "act".

It will be understood also be those skilled in the art that, in fulfillment of the patent statutes of the United States, Applicant(s) has disclosed at least one enabling and working embodiment of each invention recited in any respective claim appended to the Specification in the present application and perhaps in some cases only one. For purposes of cutting down on patent application length and drafting time and making the present patent application more readable to the inventor(s) and others, Applicant(s) has used from time to time or throughout the present application definitive verbs (e.g., "is", "are", "does", "has", "includes" or the like) and/or other definitive verbs (e.g., "produces," "causes" "samples," "reads," "signals" or the like) and/or gerunds (e.g., "producing," "causing", "using," "taking," "keeping," "making," "sampling," "determining," "measuring," "calculating," "reading," "signaling," or the like), in defining an aspect/feature/element of, a step of, an action of or functionality of, and/or describing any other definition of an aspect/feature/element of or step of or action/functionality of, an embodiment or portion of an embodiment of a method or apparatus which is within the subject matter being disclosed. Wherever any such definitive word or phrase or the like is used to describe an aspect/feature/element of or step of or action or functionality of or the like of any of the one or more embodiments or portions of embodiments disclosed herein, e.g., any feature, element, system, sub-system, component, sub-component, process or algorithm step, particular material, or the like, it should be read, for purposes of interpreting the scope of the claimed subject matter of what applicant(s) has invented, and claimed in the appended claims, to be preceded by one or more, or all, of the following limiting phrases, "by way of example," "for example," "as an example," "illustratively only," "by way of illustration only," etc., and/or to include any one or more, or all, of the phrases "may be," "can be", "might be," "could be" and the like. All such aspects, features, elements, steps, materials, actions, functions and the like should be considered to be described only as a possible aspect of the one or more disclosed embodiments or portions of embodiments and not as the sole possible implementation of any one or more aspects/features/elements of or steps of or actions/functionalities of, or the like of, any embodiments or portions of embodiments and/or the sole possible embodiment of the subject matter of what is claimed, even if, in fulfillment of the requirements of the patent statutes, Applicant(s) has disclosed only a single enabling example of any such aspect/feature/element of or step of or action or functionality of, or the like of, an embodiment or portion of an embodiment of the subject matter of what is claimed. Unless expressly and specifically so stated in the present application or the prosecution of this application, that Applicant(s) believes that a particular aspect/feature/element or step of or action or functionality of, or the like of, any disclosed embodiment or any particular disclosed portion of an embodiment of the subject matter of what is claimed, amounts to the one an only way to implement the subject matter of what is claimed or any aspect/feature/element or step of or action/functionality or the like of the subject matter disclosed and recited in any such claim, Applicant(s) does not intend that any description of any disclosed aspect/feature/element or step of or action or functionality or the like of, any disclosed embodiment or portion of an embodiment of the subject matter of what is disclosed and claimed in the present patent application or the entire embodiment shall be interpreted to be such one and only way to implement the subject matter of what is disclosed and claimed or any aspect/feature/element or step of or action or functionality of or the like of such subject matter, and to thus limit any claim which is broad enough to cover any such disclosed implementation along with other possible implementations of the subject matter of what is claimed, to such disclosed aspect/feature/element or step of or action/functionality of or the like of such disclosed embodiment or any portion of such embodiment or to the entirety of such disclosed embodiment. Applicant(s) specifically, expressly and unequivocally intends that any claim that has depending from it a dependent claim with any further detail of any aspect/feature/element, step, action, functionality or the like of the subject matter of what is recited in the parent claim or claims from which it directly or indirectly depends, shall be interpreted to mean that the recitation in the parent claim(s) was broad enough to cover the further detail in the dependent claim along with other possible implementations and that the further detail was not the only way to implement the aspect/feature/element claimed in any such parent claim(s), and thus that the parent claim be limited to the further detail of any such aspect/feature/element, or step, or action/functionality, or the like, recited in any such dependent claim to in any way limit the scope of the broader aspect/feature/element or step or action/functionality or the like of any such parent claim, including by incorporating the further detail of the dependent claim into the parent claim.

We claim:

1. An apparatus comprising:
a pulsed gas discharge laser lithography light source comprising:
a seed laser portion providing a seed laser output light beam of seed pulses;
an amplifier portion receiving the seed laser output light beam and amplifying the optical intensity of each seed pulse to provide a high power laser system output light beam of output pulses;
a pulse stretcher increasing the number of peaks in the output pulse and decreasing the average peak intensity of each of the output pulses by passing the output pulses through a pair of optical delay paths in series;
the pulse stretcher comprising:
a first beam splitter operatively connected with the first delay path and a second pulse stretcher operatively connected with the second delay path;
a first optical delay path tower containing the first beam splitter;
a second optical delay path tower containing the second beam splitter;
one of the first and second optical delay paths comprising:
a plurality of mirrors defining the respective optical delay path including mirrors located in the first tower and in the second tower;
the other of the first and second optical delay paths comprising:
a plurality of mirrors defining the respective optical delay path including mirrors only in one of the first tower and the second tower.

2. The apparatus of claim 1 further comprising:
the first optical delay path and the second optical delay path being of unequal length.

3. The apparatus of claim 1 further comprising:
the first optical delay path being longer than the second optical delay path.

4. The apparatus of claim 2 further comprising:
the one of the first and second optical delay towers containing mirrors in both of the first and second towers being the longer of the first and second optical delay paths.

5. The apparatus of claim 3 further comprising:
the one of the first and second optical delay towers containing mirrors in both of the first and second towers being the longer of the first and second optical delay paths.

6. The apparatus of claim 4 further comprising:
the longer of the first and second optical delay paths being the first optical delay path.

7. The apparatus of claim 1 further comprising:
the mirrors comprising imaging mirrors.

8. The apparatus of claim 6 further comprising:
the mirrors comprising imaging mirrors.

9. The apparatus of claim 1 further comprising:
the mirrors comprising confocal mirrors.

10. The apparatus of claim 6 further comprising:
the mirrors comprising confocal mirrors.

11. The apparatus of claim 8 further comprising:
the mirrors comprising confocal mirrors.

* * * * *